US009818869B2

(12) United States Patent
Sakai et al.

(10) Patent No.: US 9,818,869 B2
(45) Date of Patent: Nov. 14, 2017

(54) FERROELECTRIC DEVICE AND METHOD OF ITS MANUFACTURE

(71) Applicants: National Institute of Advanced Industrial Science and Technology, Tokyo (JP); WACOM R&D Corporation, Tokyo (JP)

(72) Inventors: Shigeki Sakai, Ibaraki (JP); Mitsue Takahashi, Ibaraki (JP); Masaki Kusuhara, Tokyo (JP); Masayuki Toda, Tokyo (JP); Masaru Umeda, Tokyo (JP)

(73) Assignees: NATIONAL INSTITUTE OF ADVANCED INDUSTRIAL SCIENCE AND TECHNOLOGY, Tokyo (JP); WACOM R&D CORPORATION, Tokyo (JP)

( * ) Notice: Subject to any disclaimer, the term of this patent is extended or adjusted under 35 U.S.C. 154(b) by 0 days.

(21) Appl. No.: 14/903,769

(22) PCT Filed: Jul. 24, 2014

(86) PCT No.: PCT/JP2014/069584
§ 371 (c)(1),
(2) Date: Apr. 20, 2016

(87) PCT Pub. No.: WO2015/012359
PCT Pub. Date: Jan. 29, 2015

(65) Prior Publication Data
US 2016/0247932 A1    Aug. 25, 2016

(30) Foreign Application Priority Data

Jul. 25, 2013 (JP) .................... 2013-155085
Jul. 26, 2013 (JP) .................... 2013-155094
Mar. 27, 2014 (JP) .................... 2014-067218

(51) Int. Cl.
*H01L 29/78* (2006.01)
*C23C 16/40* (2006.01)
(Continued)

(52) U.S. Cl.
CPC ........ *H01L 29/78391* (2014.09); *C23C 16/40* (2013.01); *H01L 21/02197* (2013.01);
(Continued)

(58) Field of Classification Search
CPC ......... H01L 29/78391; H01L 21/02271; H01L 21/02197; H01L 29/516; H01L 29/6684;
(Continued)

(56) References Cited

U.S. PATENT DOCUMENTS 5,618,761 A      4/1997 Eguchi et al.
6,153,898 A *   11/2000 Watanabe ............... H01L 28/56
                                                        257/295

(Continued)

FOREIGN PATENT DOCUMENTS

JP      08-139043        5/1996
JP      2002-305289      10/2002
(Continued)

OTHER PUBLICATIONS

International Search Report, PCT/JP2014/069584, Oct. 28, 2014.

*Primary Examiner* — Jarrett Stark
(74) *Attorney, Agent, or Firm* — Young & Thompson

(57) ABSTRACT

A ferroelectric device and a manufacturing method are provided. While holding a nonvolatile memory retention capability and a multiple rewriting endurance as the distinctive features of a ferroelectric device, the disclosed ferroelectric device is wider in memory window and more adaptively made microfiner than a conventional ferroelectric device that has used a ferroelectric mainly constituted of Sr—Bi—Ta—O as an oxide of strontium, bismuth and (Continued)

tantalum. Directly on or with intermediary of an insulator on a semiconductor there are layered a first ferroelectric and a conductor to form a gate stack, the first ferroelectric being mainly constituted of Sr—Ca—Bi—Ta—O as an oxide of strontium, calcium, bismuth and tantalum and being built up by a metal organic vapor deposition technique from a suitable film-forming raw material. The gate stack is heat-treated to cause the first ferroelectric to develop its ferroelectricity.

25 Claims, 12 Drawing Sheets

(51) Int. Cl.
    *H01L 21/28*     (2006.01)
    *H01L 29/51*     (2006.01)
    *H01L 29/66*     (2006.01)
    *H01L 21/02*     (2006.01)
    *H01L 27/1159*     (2017.01)

(52) U.S. Cl.
    CPC .. *H01L 21/02271* (2013.01); *H01L 21/28291* (2013.01); *H01L 29/516* (2013.01); *H01L 29/6684* (2013.01); *H01L 27/1159* (2013.01)

(58) Field of Classification Search
CPC H01L 21/28291; H01L 27/1159; C23C 16/40
See application file for complete search history.

(56) References Cited

U.S. PATENT DOCUMENTS

| | | | |
|---|---|---|---|
| 6,441,417 B1* | 8/2002 | Zhang | H01L 21/28291 257/295 |
| 7,226,795 B2 | 6/2007 | Sakai | |
| 8,304,823 B2* | 11/2012 | Boescke | G11C 11/22 257/295 |
| 2004/0057274 A1* | 3/2004 | Dimmler | G11C 11/22 365/145 |
| 2006/0017120 A1 | 1/2006 | Sakai | |
| 2008/0017914 A1* | 1/2008 | Natori | H01L 27/115 257/315 |
| 2012/0021138 A1* | 1/2012 | Ditizio | C23C 16/409 427/539 |

FOREIGN PATENT DOCUMENTS

| | | |
|---|---|---|
| JP | 2004-304143 | 10/2004 |
| JP | 2008-219026 | 9/2008 |
| JP | 2012-151497 | 8/2012 |

* cited by examiner

FERROELECTRIC DEVICE AND METHOD OF ITS MANUFACTURE

TECHNICAL FIELD

The present invention relates to a ferromagnetic device and a method of its manufacture. The invention is concerned with a ferroelectric device such as, e. g., a semiconductor transistor in which its gate insulator film is constituted as a multi-layered structure including a ferroelectric, as well as to a method of making such devices.

BACKGROUND ART

A transistor using a ferroelectric for its gate insulator film which allows data storage and data reading and writing to be conducted by the single transistor is expected to be a highly integrated memory in the next generation. Transistors of this type have their electrical conduction controlled corresponding to directions of the electric polarization of a ferroelectric. While their prototype is an MFS transistor having an MFS (metal, ferroelectric and semiconductor) laminated structure, a structure is also being investigated in which so that both characteristics of the semiconductor and ferroelectric may not be impaired; a buffer insulator is interposed between them (see, Patent References 1 and 2). Transistors having this structure are known as a MFIS (metal, ferroelectric, insulator and semiconductor) transistor.

The MFS and MFIS transistors are each expected in principle to possess features that (1) the use of electric polarization causes data not to disappear if power supply is switched off; (2) reading can be operated only by seeing electrical conduction between source and drain electrodes of the transistor and data are not destructed in content after the reading operation; and (3) both data reading and writing speeds are high as is the DRAM.

Conventional MFS and MFIS transistors have had the problem, however, that data written on them when seen to operate as a memory transistor do disappear in one day at the longest after writing (see Non-patent References 1 and 2).

To with, for those conventional MFS and MFIS transistors it was not possible to retain data for a term which their implementation requires. This is believed to be mainly due to large leakage currents through the buffer layer and ferroelectric, causing charges to store in the vicinity of an interface between the ferroelectric and buffer layer and the charges to shield electric polarization in the ferroelectric, and making it impossible to control electrical conduction of channels of the transistor by means of their electric polarization.

The problem also arises that a voltage needed for application to the MFS or MFIS when writing data on the ferroelectric tends to be mostly applied to the buffer layer if its dielectric constant is low.

Thus, the present inventors have proposed in Patent References 3 and 4 an MFS or MFIS transistor, i.e., a semiconductor ferroelectric device, which can practically be implemented with the ability to hold a data for a certain extent of term, as well as a method of making the device.

In Patent Reference 3 there is provided a memory transistor whose data storage term is indeed sufficiently long and in which the insulator buffer layer is composed of $Hf_{1-x}Al_{2x}O_{2+X+Y}$ or $Hf_{2+u}$ doped with nitrogen to allow the leakage currents across both the insulator buffer layer and ferroelectric to be held low.

In Patent Reference 4 there is provided a method of making a semiconductor ferroelectric memory device having a transistor in which an insulator buffer layer mainly constituted of hafnium oxide, a ferroelectric and a gate electrode are laminated in this order on a semiconductor substrate or semiconductor area having a source and a drain region, the method including the steps of a semiconductor surface treatment, forming the insulator buffer layer, forming a layer of the ferroelectric, forming the gate electrode and a heat treatment and being characterized in that the said step of forming the insulator buffer layer is carried out in a gaseous atmosphere having nitrogen and oxygen mixed together at a molar ratio ranging between 1:1 and $1:10^{-7}$.

While the ferroelectric of such MFS and MFIS transistors have often been constituted using a ferroelectric mainly composed of an STB such as Sr—Bi—Ta—O that is an oxide of strontium Sr, bismuth Bi and tantalum Ta, in an MFS or MFIS transistor being developed so as to be finer or smaller a demand has also come to arise that the gate electrode in length and the ferroelectric film in thickness be further reduced.

The present inventors have focused their efforts on the study of MFIS transistors having a wide memory window even if the ferroelectric has a thickness of 200 nm or less, and made it known in Patent and Non-Patent References 3 and 5 to provide a MFS or MFIS transistor suitably using a ferroelectric whose main component is an SCBT that is an oxide of strontium Sr, calcium Ca, bismuth Bi and tantalum Ta, such as Sr—Bi—Ta—O. As an example of development of the fine ferroelectric device an MFIS transistor having a gate length of 260 nm using an SBT ferroelectric has been made known (see Non-patent Reference 4).

Also in the MFS or MFIS transistor, it is mentioned that covering its gate stack with a buildup of the ferroelectric layer or the buffer and ferroelectric layers widens the memory window, the buildup also serving as a side face protective layer (see Patent Reference 6).

PRIOR ART REFERENCES

Patent References

Patent Document 1: JP 2001-291841 A
Patent Document 2: JP 2002-353420 A
Patent Document 3: JP 2004-304143 A
Patent Document 4: JP 2009-044195 A
Patent Document 5: WO 2013183547 A1
Patent Document 6: JP 4822547 B

Non-Patent References

Non-patent Reference 1: S. Migita et al., Integrated Ferroelectrics Vol. 4-, pp. 135-143, 2001
Non-patent Reference 2: (in Japanese) S. Migita et al., The Institute of Electronics, Information and Communication Engineers, Treatises, Vol. J85-C, No. 1 (January 2002), pp 14-22
Non-patent Reference 3: Wei Zhang, Mitsue Takahashi and Shigeki Sakai, Semiconductor Science and Technology, vol. 28, 085003 (7pp), 2013
Non-patent Reference 4, Le Van Hai, Mitsue Takahashi and Shigeki Sakai, 2011 IEEE Proceedings of the 3rd International Memory Workshop p. 175

SUMMARY OF THE INVENTION

Problems to be Solved by the Invention

The SCBT which such as Sr—Ca—Bi—Ta—O is an oxide of strontium Sr, calcium Ca, bismuth Bi and tantalum Ta is a material more suitable than the SBT which such as Sr—Bi—Ta—O is an oxide of strontium Sr, bismuth Bi and tantalum Ta to make a ferroelectric device such as MFS or MFIS transistor finer. The SCBT has so far been formed by a pulsed Laser Deposition (PLD) technique. The PLD technique is superior in a laboratory but not so in productivity and mass productivity. It is not in the ability to control the composition, either.

Also, to form the SCBT by using a metal organic chemical vapor deposition (MOCVD) technique, it was noted that a raw complex composition or material suitable for applications to the ferroelectric device such as MFS or MFIS transistor, especially that for introducing Ca, had not yet been known of, and it had been left unclear, either, what was an optimum composition of SCBT there.

Also in recent years, researches for making an MFS or MFIS transistor finer or smaller have been developed to an extent of reaching a gate length of 260 nm. And, a second ferroelectric layer aimed at lateral protection of a conventional gate stack is being sought to be made thinner in physical thickness down to 100 nm or less, preferably 10 nm or less.

On succeeding to actually make a ferroelectric transistor having a gate length of 260 nm or less in further advancing the researches, however, it has been found by the present inventors that various problems arose which had not been experienced in a ferroelectric transistor whose gate length is 260 nm or more. It has been shown, for example, that the memory window tends to be narrowed with the data retention term or time period tending to be reduced.

Furthermore, in order to prevent data miswriting or writing in error due to the shortness of a physical distance between neighboring MFS or MFIS transistors when made finer and more densely arranged in high integration, an insulator aimed at device separation between the neighboring MFS or MFIS transistors is sought to have its dielectric constant lowered and its equivalent $SiO_2$ film thickness increased. It is undesirable for the insulator aimed at device separation between the neighboring transistors to be occupied for its most part with a ferroelectric whose dielectric constant has been known to be high.

Also, while side faces of a gate stack are damaged by etching or ion implantation, it has been found that in a ferroelectric device made finer or smaller in gate length in which a proportion in volume of the gate stack in the vicinity of the side faces is relatively increased, the damage to the gate stack by etching and ion implantation is largely manifested in effect. In order to achieve restoring the side faces of the gate stack from damaging by etching and implantation, it has been found that it is desirable that in contact with the side face of a first ferroelectric in the gate stack, there be brought a second ferroelectric composed of the elements same as those of the first ferroelectric, the first and second ferroelectrics while in contact with each other being then heat-treated.

Also, generally in the manufacture of a ferroelectric device, a step of heat treatment is necessary whereby the ferroelectricity of a first ferroelectric is caused to develop. If a second ferroelectric formed in a layer on the gate side face is heat-treated, it is inevitable that a surface of semiconductor, e. g. Si, may be oxidized, forming a film of semiconductor oxide, e. g. $SiO_2$, growing on the semiconductor surface and which is small in dielectric constant. The smaller the dielectric constant of the semiconductor oxide and the thicker its physical film thickness, i.e. the greater the $SiO_2$ converted film thickness, more will be reduced the voltage apportioned to the first ferroelectric of the total voltage applied across MFS or MFIS gate conductors. As a result, an inconvenience arises that a ferroelectric device such as an MFS or MFIS has a memory window reduced.

The semiconductor oxide of low dielectric constant tends to grow on the semiconductor surface closer to the outside, i.e. on a side face of the gate stack and thicker than the inside remote from the side face of the gate stack. Thus, especially in the manufacture of a ferroelectric device made finer so that a proportion in volume in the vicinity of the side face of a gate stack becomes large relative to the entire gate stack, it has been found essential that the gate stack be heat-treated upon having been coated with an insulator which is composed of a material suitable, and that is of a physical thickness sufficient, to assume a role to control permeation of oxygen from the outer environment into the gate stack.

It should be noted here that all these findings as mentioned above were first made by the present inventors.

It is an object of the present invention to provide a method of making a ferroelectric device, as well as a ferroelectric device as made, the ferroelectric device holding a nonvolatile memory retention capability and a multiple rewriting endurance as distinctive features of an ferroelectric device, the method being superior in productivity, mass productivity, and controllability of material compositions to the conventional film-forming methods, the method using a ferroelectric SCBT material film-formed of a proper composition from a proper film-forming raw material to exhibit a wider memory window, the method being capable of relieving an etching damage on the side faces of a gate stack and restraining growth of an oxide on a semiconductor surface, the method being capable of manufacturing a ferroelectric device adaptively made microfiner and exhibiting a wider memory window.

Means for Solving the Problems

In accordance with the present invention, there is provided a method of making a ferroelectric device having a semiconductor on which is had a multi-layered structure having an insulator, a ferroelectric and a conductor built up in this order or a multi-layered structure having a ferroelectric and a conductor built up in this order, the method being characterized in that it comprises making a layer of the said ferroelectric in a metal organic chemical vapor deposition process or technique which comprises the steps of: preparing a raw material liquid solution or solutions having complex compounds each dissolved in a solvent, the complex compounds containing strontium, calcium, bismuth and tantalum; dispersing the raw material liquid solution(s) into a carrier gas to form a raw material gaseous medium in a state of gas and liquid two phases; introducing the raw material gaseous medium while in the state of gas and liquid two phases into a vaporizing chamber to form a vapor thereof; and introducing the vapor into a film forming chamber.

There is also provided a method of making a ferroelectric device having a semiconductor on which is had a gate stack comprising layers of an insulator, a first ferroelectric and a conductor built up in this order or a gate stack comprising layers of a first ferroelectric and a conductor built up in this order, the method being characterized in that it comprises the step in which layers of a second ferroelectric and an insulator that has a dielectric constant of not more than 10 are built up in this order so that the second ferroelectric may lie in contact with at least the first ferroelectric on a side face of the said gate stack; and the step of thereafter heat-treating the said gate stack.

Also provided is a method of making a ferroelectric device having a semiconductor on which is formed a gate stack comprising layers of an insulator, a first ferroelectric and a conductor built up in this order or a gate stack comprising layers of a first ferroelectric and a conductor built up in this order, the method being characterized in that it comprises the step in which a layer of a second ferroelectric mainly constituted of an oxide of strontium, calcium, bismuth and tantalum is formed by a metal organic chemical vapor deposition process so as to lie in contact with at least the said first ferroelectric on a side face of the said gate stack.

Additionally disclosed is a method of making a ferroelectric device wherein the layer of the said second ferroelectric has a thickness of not more than 100 nanometers.

Another embodiment provides a method of making a ferroelectric device wherein the layer of the said second ferroelectric has a thickness of not more than 10 nanometers.

Moreover, there is provided a method of making a ferroelectric device wherein the said second ferroelectric is made by a metal organic chemical vapor deposition process which comprises: preparing a raw material liquid solution or solutions having complex compounds each dissolved in a solvent, the complex compounds containing strontium, calcium, bismuth and tantalum; dispersing the raw material liquid solution(s) into a carrier gas to form a raw material gaseous medium in a state of gas and liquid two phases; introducing the raw material gaseous medium while in the state of gas and liquid two phases into a vaporizing chamber to form a vapor thereof; and introducing the vapor into a film forming chamber.

In a further embodiment, of the said layer of the second ferroelectric formed, a portion on the side face of the said gate stack is left and a portion on a non-gate surface area of the said semiconductor and other than that on which the said gate stack is formed is removed in which state a source and a drain region are thereafter formed on the surface of the said semiconductor.

In yet another embodiment, removal of the said portion of the layer of the second ferroelectric is effected without masking or masklessly.

In another variation, removal of the said portion of the said layer of the second ferroelectric on the semiconductor surface area is effected by an RIE technique.

As a further variation, said complex that contains calcium is $Ca[Ta(OC_2H_5)_5(OC_2H_4OCH_3)]_2$ or $Ca(C_{11}H_{19}O_2)_2$.

Alternatively, it is disclosed that the said first ferroelectric is mainly composed of an oxide of strontium, calcium, bismuth and tantalum and has a proportion of strontium to calcium of 1−x:x wherein x is not more than 0.5.

In yet a furter embodiment, the said second ferroelectric is mainly composed of an oxide of strontium, calcium, bismuth and tantalum and has a proportion of strontium to calcium of 1−x:x wherein x is not more than 0.5.

It is also possible that the device has a gate length of not more than 200 nm.

Also disclosed is a ferroelectric device that comprises a semiconductor on which is had a multi-layered structure having an insulator, a ferroelectric and a conductor built up in this order or a multi-layered structure having a ferroelectric and a conductor built up in this order, the said ferroelectric being a ferroelectric made by a metal organic chemical vapor deposition technique, wherein the said metal organic chemical vapor deposition technique comprises: preparing a raw material liquid solution or solutions having complex compounds each dissolved in a solvent, the complex compounds containing strontium, calcium, bismuth and tantalum; dispersing the raw material liquid solution(s) into a carrier gas to form a raw material gaseous medium in a state of gas and liquid two phases; introducing the raw material gaseous medium while in the state of gas and liquid two phases into a vaporizing chamber to form a vapor thereof; and introducing the vapor into a film forming chamber.

Such device may include a semiconductor on which is had a gate stack comprising layers of an insulator, a first ferroelectric and a conductor built up in this order or a gate stack comprising a first ferroelectric and a conductor built up in this order; and that layers of a second ferroelectric and an insulator that has a dielectric constant of not more than 10 are built up in this order so that the second ferroelectric may lie in contact with at least the first ferroelectric on a side face of said gate stack, the said gate stack formed with said layers of the second ferroelectric and the insulator that has a dielectric constant of not more than 10 being thereafter heat-treated.

In another embodiment, the ferroelectric device comprises a semiconductor on which is had a gate stack comprising layers of an insulator, a first ferroelectric and a conductor built up in this order or a gate stack comprising layers of a first ferroelectric and a conductor built up in this order; that a layer of a second ferroelectric is built up so as to lie in contact with at least the first ferroelectric on a side face of the said gate stack; and that the layer of the said second ferroelectric is mainly constituted of an oxide of strontium, calcium, bismuth and tantalum, the said oxide being made by a metal organic chemical vapor deposition technique.

In another variation, the layer of the said second ferroelectric formed, a portion on the side face of the said gate stack is left and a portion on a non-gate surface area of the said semiconductor and other than that on which the said gate stack is formed is removed in which state a source and a drain region are thereafter formed on the surface of the said semiconductor.

The ferroelectric device may be formed with a gate electrode in a self-alignment manner by ion implantation effected with a mask served by the said gate stack and the said second ferroelectric layer formed on the said side face.

In another embodiment, the surface of the semiconductor has no oxide thereof substantially included therein.

In a further embodiment, the said first ferroelectric has no impurity substantially included therein that is to be implanted into the source or drain electrode.

The ferroelectric device may also be configured so that the layer of the said second ferroelectric has a thickness of not more than 100 nanometers.

Alternatively, the layer of the said second ferroelectric may have a thickness of not more than 10 nanometers.

In yet a further embodiment, the said second ferroelectric is made by a metal organic chemical vapor deposition technique or process which comprises: preparing a raw material liquid solution or solutions having complex compounds each dissolved in a solvent, the complex compounds containing strontium, calcium, bismuth and tantalum; dispersing the raw material liquid solution(s) into a carrier gas to form a raw material gaseous medium in a state of gas and liquid two phases; introducing the raw material gaseous medium while in the state of gas and liquid two phases into a vaporizing chamber to form a vapor thereof; and introducing the vapor into a film forming chamber.

As another alternative, the ferroelectric device can be constructed so that the said complex containing calcium is $Ca[Ta(OC_2H_5)_5(OC_2H_4OCH_3)]_2$ or $Ca(C_{11}H_{19}O_2)_2$.

The ferroelectric device may have the said first ferroelectric mainly composed of an oxide of strontium, calcium, bismuth and tantalum and has a proportion of strontium to calcium of 1−x:x wherein x is not more than 0.5.

As a further alternative, the said first ferroelectric is mainly composed of an oxide of strontium, calcium, bismuth and tantalum and has a proportion of strontium to calcium of 1−x:x wherein x is not more than 0.5.

In a final embodiment, the device has a gate length of not more than 200 nm.

Effects of the Invention

According to the present invention, it can be implemented and realized to write and to read data with a single transistor size. Moreover, the data written is not to disappear, for a practically sufficiently long time.

And, data read out is not to be destroyed in contents. A ferroelectric device according to the present invention can be used in a variety of circuit such as for a semiconductor memory in a wide range of applications, and further for a temporary storage device and the like that is stable in a semiconductor logic circuit. According to the present invention, furthermore, ferroelectric devices if micronized are to have wider memory windows achieved.

A ferroelectric device according to the present invention is especially effective and significant with a gate stack small in volume. To with, while if the gate length is 200 nm or less, the data retention time period has hitherto been shortened and the memory window narrowed, it has been found that a ferroelectric device according to the invention can exhibit a wider memory window for a prolonged period of time.

With a gate stack formed on its side faces with a lateral wall layer constituted of a second ferroelectric identical in composition to the first ferroelectric, a wider memory window is achieved having a prolonged data retention time period. Such effects are not attainable by a sputtering or the conventional MOCVD technique to form such a lateral wall layer. For, it has been found that sputtering is not good in step coating ability while the conventional MOCVD technique tends to contain C as a contaminant; it is presumed that this may shorten the data retention time period.

Since such an excess portion of the second ferroelectric layer that is directly in contact with the substrate can be removed masklessly by anisotropic etching, a process step for manufacture can be saved.

In the conventional deposition techniques, thinner becomes in film thickness the deposition of a side face than the deposition on a substrate. Damage is likely incurred higher on the side faces of a gate stack, even by anisotropic etching. In the deposition method according to the present invention, however, there should be no substantial difference in film thickness or denseness between the deposit on the side face and the deposit on the substrate. Accordingly, with no substantial damage incurred on the built-up film on the side faces, the built-up layer directly on the substrate surface can be removed by etching.

The lateral wall layer should have a thickness, preferably of 200 nm or less, and more preferably of 10 nm or less. From the standpoint of recovery from etching damage, the lateral wall layer should preferably be thick to a degree. However, the thicker the lateral wall layer, the larger becomes the size of a transistor including the lateral wall layer. According to the present invention, the lateral wall layer composed of SCBT, even of 100 nm or less, contributes to recovery fully from etching damage and in turn can achieve a prolonged data retention time period. The thickness may be 10 nm or less and should preferably be 5 nm or more as its lower limit.

Figure 1:
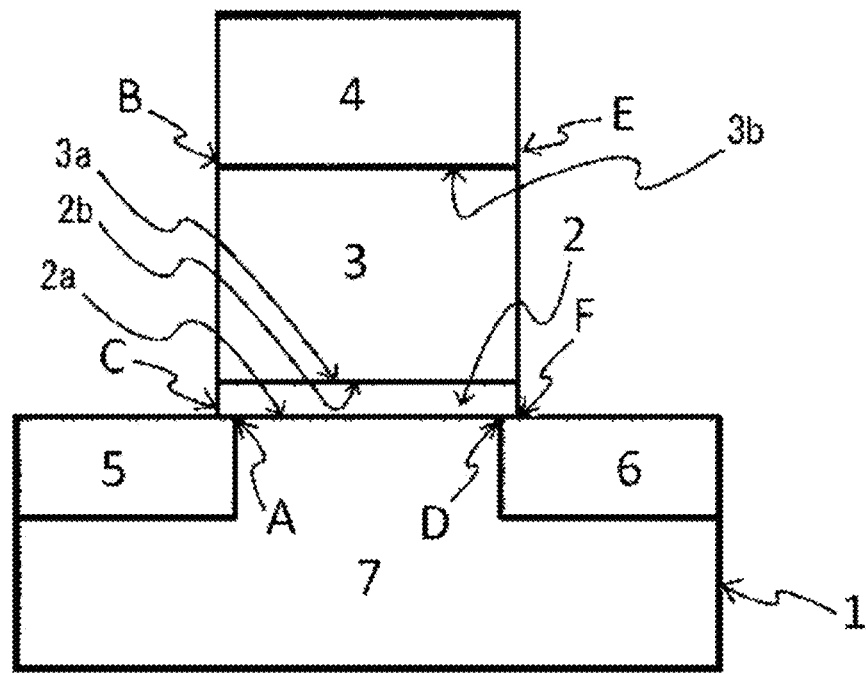
FIG. 1 is a conceptual structural view illustrating in cross section a ferroelectric device according to the present invention.

DESCRIPTION OF REFERENCE CHARACTERS 1 semiconductor
2 insulator
3 ferroelectric
4 conductor (gate electrode)
5, 5a source region in the semiconductor
6, 6a drain region in the semiconductor
7 region excepting the source and drain regions on the semiconductor 8 lateral wall layer as a second ferroelectric
9 protective layer as an insulator whose dielectric constant is 10 or less
20 vaporizing tube
21 heating means
22 vaporizing part
23 connection part
93 carrier gas
92 gas passage
94 gas intake port
95 raw material solution
96 raw material feed orifice
97 gas outlet
98 dispersing part

MODES FOR CARRYING OUT THE INVENTION

FIG. 1 illustrates an example of ferroelectric device according to the present invention, in which a semiconductor 1 is first prepared. Here, the semiconductor 1 may be a substrate of thin film mono- or poly-crystalline silicon, or germanium or of a mixed crystal of silicon and germanium, or of SiC or GaAs, or of any other compound semiconductor. It is not intended here to be of any specific limitation. Further, in lieu of the semiconductor substrate there may be used an SOI (silicon on insulator).

A surface of the semiconductor 1 has a surface 2a of insulator 2 connected thereto. The insulator 2 may be of an oxide of hafnium, $HfO_{2+u}$, or an oxide of hafnium and aluminum, $Hf_{1-x}Al_{2x}O_{2+x+y}$, formed in which x should range so as to fortify chemical stability and/or to have a large dielectric constant of the insulator 2, preferably as $0<x<0.7$. And, for its better insulating properties, y and u should range preferably as $-0.2<y<0.2$ and $-0.2<u<0.2$, respectively. The thickness (t) of an $HfO_{2+u}$ or $Hf_{1-x}Al_{2x}O_{2+x+y}$ film should range preferably as 4 nm<t<40 nm so as to reduce the absolute value of a voltage for application required to determine a state of date writing, i.e. a state of electric polarization.

An opposite surface 2b of the insulator 2 has a surface 3a of a first ferroelectric 3 connected thereto. In accordance with the present invention, the first ferroelectric 3 used may be a ferromagnetic mainly constituted of an SCBT substance such as Sr—Ca—Bi—Ta—O which is an oxide of strontium Sr, calcium Ca, bismuth Bi and tantalum Ta.

The first ferroelectric 3 should have a thickness (d) ranging so as to reduce the absolute value of a voltage for application required to set a state of date writing, i.e. a state of electric polarization, preferably as 20 nm<d<600 nm, more preferably as 80 nm<d<300 nm, and further preferably as 100 nm<d<210 nm.

The first ferroelectric 3 has an opposite surface 3b connected to a conductor 4. The conductor 4 may be any of conductors including a nitride such as TiN or TaN and an oxide such as $IrO_2$ or $RuO_2$. Also, it may be a laminate of such conductors, e.g.

Moreover, the semiconductor 1 in general has a source and a drain region 5 and 6, and a region 7 other than the source and drain regions 5 and 6. If the source region 5 and the drain region 6 are of n type, the region 7 excepting the source and drain regions 5 and 6 is of p type. If the source region 5 and the drain region 6 are of p type, the region 7 excepting the source and drain regions 5 and 6 is of n type.

It should be noted further that the insulator 4 may not be formed positively. Then, the one surface of the semiconductor 1 is connected to the surface 3a of the ferroelectric 3. If the insulator 2 is not positively formed, a step of heat treatment included in a method of making a ferroelectric device according to the present invention allows an oxide of the semiconductor 1 to grow automatically at an interface between the semiconductor 1 and the first ferroelectric 3 with the result that a layer having a function as of the insulator 2 is inserted between them.

[Operation]

The source for storing data being electric polarization of the first ferroelectric 3, the ferroelectric to allow it to develop its ferroelectricity must be heat-treated in the step while or after it is formed to rise its temperature so as to render it crystalline or polycrystalline. A crystalizing or poly-crystalizing temperature is normally in a range between 650 and 950° C. In general, the higher the temperature, the better the crystallinity and the ferroelectricity as well. The step of heat treatment is of a time duration ranging typically between 20 minutes and 1 hour.

If use is made of a silicon substrate for the semiconductor 1, forming a source and a drain region in the silicon substrate requires heat treatment at a temperature of at least 950° C. to 1050° C. for a short time period (typically 30 seconds or less) for activation of an impurity or impurities therein. The insulator 3 in a standard process of manufacture in which it undergoes a step of heat treatment for crystallization or poly-crystallization of the first ferroelectric undergoes a step of heat treatment for forming the source and drain regions as well.

If the insulator 2 is composed of an inappropriate material, it would have been crystallized in these steps of heat treatment so that leakage current may pass through grain boundary between crystal grains. If the insulator 2 is composed of $HfO_{2+u}$ or $Hf_{1-x}Al_{2x}O_{2+x+y}$ as in a form of implementation of the present invention, the insulator 2 is not crystalized to maintain an amorphous state or in part crystalized to coexist with the amorphous state. Thus, the leakage current passing through the insulator 2 can be held low. It should further be noted that the insulator 2 used may not only be $HfO_{2+u}$ or $Hf_{1-x}Al_{2x}O_{2+x+y}$ but may also be oxide Hf—Si—O having constituent elements of hafnium and silicon, oxide Hf—La—O having constituent elements of hafnium and lanthanum, oxide Hf—La—Al—O having constituent elements of hafnium, lanthanum and aluminum, oxide Hf—Ta—O having constituent elements of hafnium and tantalum or a hafnium based oxide, or a layer or layers thereof.

A surface of the insulator 2 in an amorphous state is flat compared with that in a crystallized state. Little seed crystal can grow from a surface of the insulator 2 in amorphous state. And, the first ferroelectric being fine in crystal grains can hold the leakage current low. On the other hand, if the insulator 2 is crystalized, its surface unevenness is increased by crystal grains and grain boundaries created. These crystal grains are liable to form seed crystal of the first ferroelectric, causing its crystal grains to grow and increasing the leakage current therethrough. Thus, using $HfO_{2+u}$ or $Hf_{1-x}Al_{2x}O_{2+x+y}$ to form the insulator 2 can hold leakage currents through both the insulator 2 and the first ferroelectric low, permitting a memory transistor to be implemented whose data retention time is verily long enough. $Hf_{1-x}Al_{2x}O_{2+x+y}$ of which a temperature in the step of heat treatment is further higher than of $HfO_{2+u}$, is advantageous especially when using as the first ferroelectric a ferroelectric having a high crystalizing temperature in physical properties.

[Method of Manufacture]

Mention is made next of a method of manufacture. It should be noted here that the method of manufacture of the present invention is not limited to specific forms of implementation as will be described below.

In methods to form an insulator 2, physical vapor deposition (PVD) techniques, apart from their principles, for example, include those of pulsed laser deposition (PLD, also known as laser ablation), sputtering and vapor deposition which are effective, and chemical vapor deposition techniques, apart from their principles, for example, include those of metal organic chemical vapor deposition (MOCVD), metal organic decomposition (MOD), sol gel method, and atomic layer deposition (ALD) which are effective.

In methods to form a first ferroelectric 3 and a conductor 4, physical vapor deposition techniques, apart from their principles, for example, are such vapor deposition techniques as those of pulsed laser deposition, sputtering, and electron beam vapor deposition which are effective, and chemical vapor deposition techniques including those of MOCVD and sol gel method which are effective.

Mention is made below of a method of manufacture on a silicon (Si) substrate as the semiconductor 1, using a pulsed laser deposition technique to form an insulator 2 and an MOCVD technique to form a first ferroelectric 3.

1. Surface Treatment of Semiconductor

After the surface of a monocrystal Si substrate is cleansed by a standard Si cleaning technique such as RCA cleaning, residual oxide on the surface is removed with dilute fluoric acid or buffer fluoric acid. Thereafter, surface treatment for oxide, nitride and the like may deliberately be added. The semiconductor 1 may not only be a monocrystal Si substrate but may also be of thin-film polycrystalline silicon, a germanium substrate, of a mixed crystal of silicon and germanium, or other, a compound semiconductor such as SiC or GaAs, whose kind is not limited to. Further, in lieu of the semiconductor substrate there may be used an SOI (silicon on insulator) substrate.

2. Forming an Insulator 2

The insulator 2 is formed, for example, by a pulsed laser deposition (PLD) technique. In order to control formation of a layer of such oxide as $SiO_2$ having a dielectric constant of as low as about 3.9, Si while forming is held under conditions of a low temperature (from room temperature to 550° C.). If the insulator 2 is an oxide having hafnium and aluminum as constituent elements thereof), let the target composition be $Hf_{1-x}Al_{2x}O_{2+x+y}$. Alternatively, the targets may be $HfO_{2+u}$ and $Al_2O_3$. In this case, although both targets can simultaneously be vaporized (sputtered), the targets may preferably be vaporized alternately for one time or a plurality of times to allow $HfO_{1-x}Al_{2x}O_{2+x+y}$ to be thermally synthesized by heat treatment. When $HfO_{2+u}$ and $Al_2O_3$ are alternately deposited, it is especially preferable if $HfO_{2+u}$ is first deposited. Furthermore, not only $HfO_{2+u}$ or $HfO_{1-x}Al_{2x}O_{2+x+y}$ but also a Hf based oxide such as Hf—Si—O, Hf—La—O, Hf—La—Al—O or Hf—Ta—O as well as a laminate thereof may be used.

If the insulator 2 is an oxide having hafnium as a constituent element thereof, let the target composition be $HfO_{2+u}$. The insulator being an oxide, oxygen is introduced while it is being formed.

In order to control and reduce formation of an oxide of low dielectric constant at an interface between Si and the insulator 2, it is especially preferable to mix nitrogen and oxygen gases together. Nitrogen acts to reduce structural defects in the insulator 2 and serves to reduce the leakage current as well. With oxygen and nitrogen gases mixed together, then the mixing molar ratio, N:O, may be equal to 1:1 to $1:10^{-7}$.

Also, since $HfO_{1-x}Al_{2x}O_{2+x+y}$ and $HfO_{2+u}$ targets themselves contain oxygen to allow Hf and Al atoms to form oxide readily, only a nitrogen gas may be introduced while the insulator 2 is being formed. In this case, the mixing molar ratio is determined by a residual amount of oxygen contained in the nitrogen gas. Typically, while the mixing molar ratio for residual oxygen N:O is equal to $1:10^{-5}$ to 1:10-7, that of nitrogen and oxygen gases may be smaller than it.

By being formed in an atmosphere containing a nitrogen gas, the insulator 2 will have nitrogen element added as an additive. The foregoing is thereby brought into effect. The content of nitrogen element is preferably from $1 \times 10^{19}$ $cm^{-3}$ to $1 \times 10^{22}$ $cm^{-3}$, more preferably from $5 \times 10^{19}$ $cm^{-3}$ to $5 \times 10^{21}$ $cm^{-3}$.

It should further be noted that an insulator may not be formed positively. In this case, a first ferroelectric is formed directly on the semiconductor 1. If the insulator 2 is not actively formed, a step of heat treatment included in a method of making a ferroelectric device according to the present invention allows an oxide of semiconductor 1 automatically to grow at an interface between the semiconductor and the first ferroelectric with the result that a layer is inserted that is identical in function to the insulator 2.

3. Forming a First Ferroelectric

The first ferroelectric in the present invention is a ferroelectric mainly constituted of an SCBT such as Sr—Ca—Bi—Ta—O as an oxide of strontium, calcium, bismuth and tantalum.

The first ferroelectric is preferably formed by a MOCVD process or technique.

Mention is made below of the findings that the MOCVD technique is preferred here, and of the findings that have led to the present invention.

The present inventors were in the process of exploring technologies to secure achieving a memory window that is wider if the ferroelectric is made thinner. Over numerous experiments, it came to knowledge that adding Ca might widen the memory window. Upon subsequent experiments, it was made known that adding Ca might not necessarily widen the memory window; there are both cases of widening and not widening it.

After investigating compositions of SCBTs formed, it has been found that in a certain range of addition of Ca, the memory window is shown to widen.

In a comparative experiment an SCBT is formed by the PLD technique. Since the composition of elements is fixed for a given laser ablation target, a method is tried in which a plurality of targets are combined. It has been found to be difficult to controllably adjust the composition ratio of strontium, calcium, bismuth and tantalum. The method in which a plurality of targets are combined requires increased time until an SCBT has been formed, and is not passable in productivity. In comparison, it has been found that a MOCVT technique is capable of controllably adjusting the composition of elements productively if the rates of flow of solutions containing complex compounds (complexes, coordination compounds) as raw materials are controlled.

Investigations are also conducted of formation of an SCBT film by the MOCVD process or technique which has been found to allow controlling a composition more accurately than other techniques. The present inventors undertook development of a complex compound of Ca adapted well to form an oxide ferroelectric of the Sr, Ca, Bi and Ta system.

As a result, there has been newly obtained Ca[Ta(OC$_2$H$_5$)$_5$(OC$_2$H$_4$OCH$_3$)]$_2$, which may hereinafter be referred to as "CT-1".

This complex compound, which is a liquid at room temperature, has been confirmed to be fully mixed with and dissolved in ethyl-cyclohexane (ECH) as an organic solvent at a given proportion for dissolution. With the complex diluted by solvent ECH, testing to form a film was performed using a MOCVD apparatus provided with a liquid and gas two phase mixed flow system which has been developed by the present inventors.

From results of testing, it has been shown that the film formed is superior in composition controllability and uniformity over the conventional film and is less in variation from film to film. The method makes the Ca composition freely controllable and is capable of forming a ferroelectric at a yield higher than the bubbling technique, a technique which gasifies by introducing a bubbling gas into a container receiving a liquid raw material, indicating that the method can better be used than the conventional bubbling method. It is noted, however, that the Ca complex composition should not be limited to "CT-1". For example, ones such and generally known as (Ca(dpm)$_2$(Ca(C$_{11}$H$_{19}$O$_2$)$_2$), Bisdipivaloylmethanato calcium are found usable as well.

3-1. MOCVD Apparatus

Figure 12:
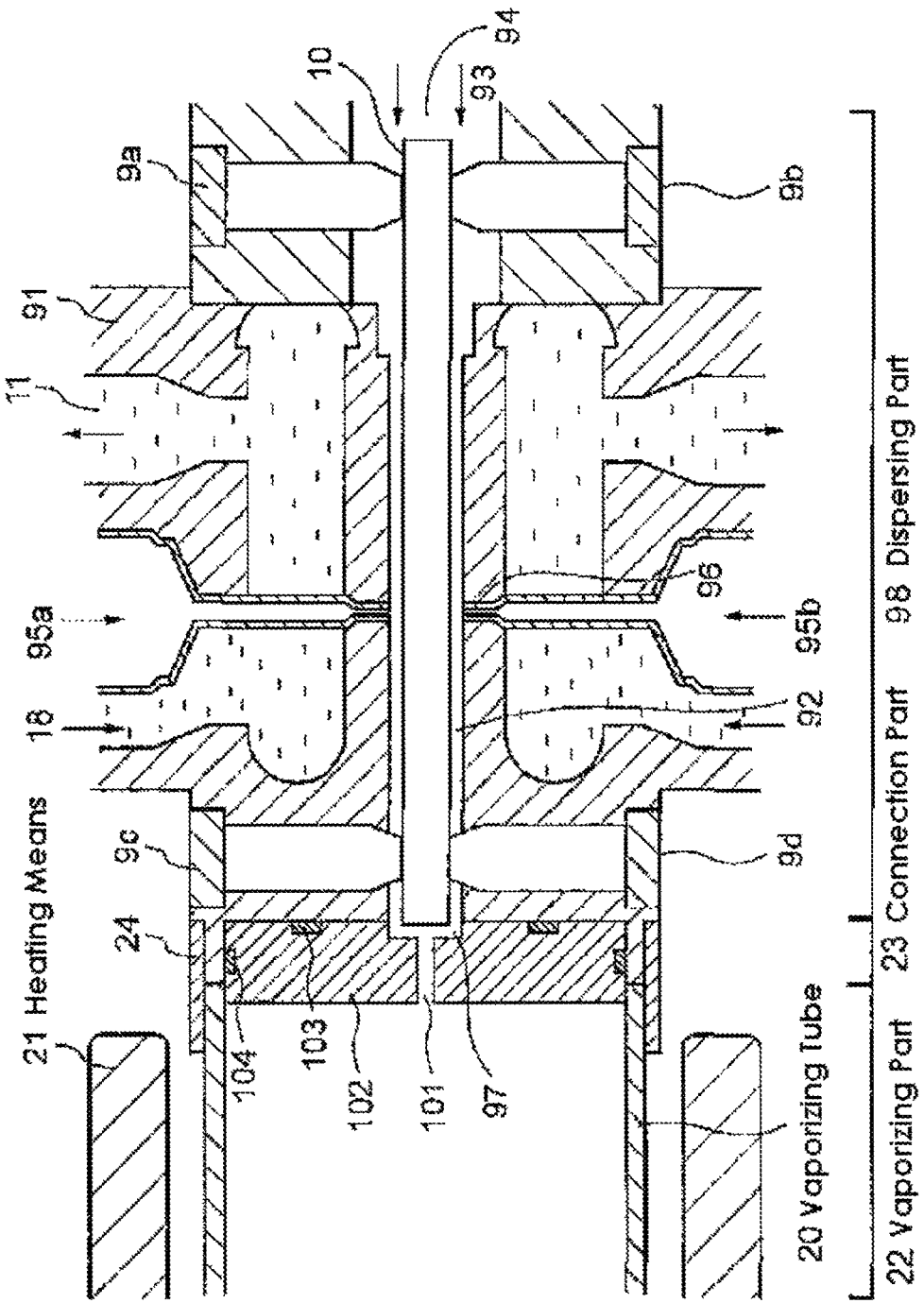
FIG. 12 is a cross sectional view of a MOCVD apparatus that can be used in implementing the present invention.

For the MOCVD apparatus, use is made of an apparatus, e.g. as shown in FIG. 12.

This form of implementation comprises:

a dispersing part 98 having a gas passage 92 formed inside of a dispersing part main body that makes up the dispersing part, and including a gas inlet port 94 for introducing a carrier gas 93 under pressure into the gas passage 92, a means (a plurality of raw material supply ports) 96 for injecting the plurality of raw material solutions, or a raw material solution as a whole, 95 into the carrier gas 93 passing through the gas passage 92 and for misting or pulverizing the raw material solutions or solution 95 in the carrier gas 93, a gas outlet port 97 for feeding a vaporizing part 22 with the misted carrier gas (raw material gas) containing the pulverized raw material solution 95 and a means (water coolant) 18 for cooling the carrier gas flowing in the gas passage 92; and a vaporizing part 22 including a vaporizing tube 20 having one end connected or to be connected to a reaction tube of the MOCVD apparatus and the other end connected to the gas outlet port 97 of the dispersing part 98, and a heating means (heater) for heating the vaporizing tube, for heating to vaporize the carrier gas 93 fed from the dispersing part 98 and having the raw material solution 95 dispersed therein, there being provided outside of the gas outlet port 97 a radiation preventing part 102 having an opening 101.

It should be noted that the gas passage 92 preferably has a cross-sectional area of 0.10 to 0.5 mm$^2$. It is hard to machine the gas passage 92 if its area cross-sectional area is less than 0.10 mm$^2$. If the area exceeds 0.5 mm$^2$, a resulting faster flow of the carrier gas makes it necessary to use an increased volume rate of its flow. Using such an increased rate of flow of the carrier gas requires a large vacuum pump of high capacity sufficient to maintain the reaction chamber at a reduced pressure (e. g. 1.0 torr). It being difficult to adopt a vacuum pump whose displacement exceeds 10,000 liters per minute (at 1.0 torr), it would be desirable that the rate of flow be adequate, i.e. that the cross-sectional area of the gas passage 92 for industrial implementation be from 0.10 to 0.5 mm$^2$.

The gas passage 92 is provided at its one end with the gas inlet port 94 which is connected to a source (not shown) of the carrier gas, e.g. N$_2$, Ar, He.

The main body of the dispersing part 98 is provided laterally around its approximate center with the raw material supply port 96 that communicates with the gas passage 92 and through which the raw material solution 95 is introduced into the latter so that it is dispersed into the carrier gas passing through the gas passage 92 to form a raw material gas.

The gas passage 92 is provided at its other end with the gas outlet port 97 communicating with the vaporizing tube 20 in the vaporizing part 22.

The dispersing part main body 98 is formed with a space 11 for passing a water coolant 18, thereby cooling the carrier gas flowing in the gas passage 92. Alternatively, instead of the space 11, there may, for example, be provided a Peltier element for cooling. In the inside of the gas passage 92 in the dispersing part 98 which is thermally affected by the heater 21 in the vaporing part 22, a solvent of the raw material solution and an organic metal complex may not simultaneously be vaporized, permitting only the solvent to be vaporized. And, so, cooling the carrier gas in which is dispersed the raw material flowing in the gas passage prevents only the solvent from vaporizing. A region downstream of the raw material supply port 96 is especially important for cooling, and at least that region is thereby cooled. The cooling temperature is here a temperature not more than a boiling point of the solvent and, for example, is 67° C. or less for THF. Especially important is a temperature at the gas outlet port 97.

This form of implementation is further provided with the radiation preventing part 102 having the opening 101 outside of the gas outlet port 97. Apropos, numerals 103 and 104 refer to a seal member such as an O ring or O rings. The radiation preventing part 102 may be composed of Teflon (registered trademark), stainless steel, ceramic or the like. As has been made known to the present inventors, heat in a vaporizing part acts via the gas outlet port 97 as a radiation heat which so far tends to overheat the gas inside of the gas passage 92 so that a component of low melting point, if cooled by the water coolant 18, in the gas may precipitate in a region of the gas outlet port 97.

The radiation preventing part comprises a member 102 for preventing such radiant heat from propagating into the gas. Thus, the small opening 101 is preferably less in cross-sectional area than, e. g. ½, more preferably ⅓, therein of the gas passage 92.

Also, by cooling the dispersing part 98, the gas passage 92 (especially, the gas outlet port 97) for use over a long period of time is prevented from clogging with a carbide or carbides.

At its downstream side, the dispersing part main body 98 is connected to the vaporizing tube 20. The connection between the dispersion part main body 98 and the vaporizing tube 20 is effected by a coupling 24 which constitutes a connection part 23, The vaporizing part 22 is comprised of the vaporizing tube 20 and the heating means (heater) 21. The heater 21 is here a heater for heating to vaporize the carrier gas 92 in which while passing in the vaporizing tube 20, the raw material solution 95 is dispersed. While the heater 21 has so far been made up of a cylindrical or mantle heater and arranged so as to be attached to the outer periphery of the vaporizing tube 20, to heat the vaporizing tube 20 so that it is even in temperature over its length a method is most preferred that uses a heating medium such as a liquid or gas whose heat capacity is large.

For the vaporing tube 20, use is preferably made of a stainless steel such as SUS316L. The vaporizing tube 20 used may be suitably sized to have a length such that it may be heated to a sufficient temperature and, e. g. to have an outer diameter of ¾ inch and a length of several hundred mm when an SCBT raw material solution of 0.04 cc is to be vaporized.

The vaporizing tube 20 is connected at its downstream end to a reaction tube in the MOCVT unit and in this form of implementation is provided with an oxygen supply port 25 as an oxygen supply means so that oxygen heated to a given temperature may be admixed into the carrier gas 93.

3-2. Conditions Suitable for the Forming Process are as Follows:

Raw Material Solution

[Sr, Ta]

Preferred as a complex of Sr and Ta is: Bis-tantal-penta-etho-oxide-2-metho-oxy-etho-oxide-strontium Sr[Ta(OC$_2$H$_5$)$_5$(OC$_2$H$_4$OCH$_3$)]$_2$ (ST-1).

The solvent used may be ethylcyclohexane (ECH).

The complex's concentration in the solvent is preferably from 0.05 to 0.25 mol/liter. The flow is preferably from 0.05 to 0.25 sccm.

If Sr and Ta are selected from separate complexes, the complex of Sr is preferably Sr(C$_{11}$H$_{19}$O$_2$)$_2$. The solvent then used can, for example, be ECH.

The complex of Ta is preferably Ta(OC$_2$H$_5$)$_5$(PET).

The solvent then used can, for example, be ECH. If St-1 is used as a complex of Sr and Ta, it is effective to use PET in order to adjust the content of Ta in a film.

The concentration in the solvent is then preferably from 0.05 to 0.20 mol/litter.

The flow is then preferably not more than 0.15 sccm.

[Bi]

The complex of Bi is preferably tris-1-methooxy-2-methyl-2-propoxy bismuth: Bi(C$_5$H$_{11}$O$_2$)$_3$(Bi (MMP)$_3$).

The solvent then used can, for example, be ECH.

The concentration in the solvent is then preferably from 0.05 to 0.25 mol/litter. Also, the flow is then preferably from 0.10 to 0.25 sccm.

[Ca]

The complex of Ca used may, for example, be Ca[Ta(OC$_2$H$_5$)$_5$(OC$_2$H$_4$OCH$^3$)]$_2$(CT-1) or Ca(C$_{11}$H$_{19}$O$_2$)$_2$. Apropos, with Ca[Ta(OC$_2$H$_5$)$_5$(OC$_2$H$_4$OCH$^3$)]$_2$ (CT-1) a reaction between Ca and 2 mol of MeOC$_2$H$_4$OH is utilized first to form Ca(OC$_2$H$_4$OMe)$_2$. In the synthesis method, Ca(OC$_2$H$_4$OMe)$_2$ formed and 2 mol of PET (Ta(OC$_2$H$_5$)$_5$) are reacted to synthesize CT-1 (Ca[Ta(OC$_2$H$_5$)$_5$(OC$_2$H$_4$OCH$_3$)]$_2$).

Solvent if necessary may, for example, be ECH.

The concentration in the solvent is then preferably from 0.05 to 0.25 mol/litter. Also, the flow is then preferably from 0.01 to 0.15 sccm.

Preparation of Gas and Liquid Two Phase Flow

In order to prepare a gas and liquid two phase flow, it is desirable that a liquid raw material and a carrier gas be supplied in rates of flow as follows:

Raw Material Solution

ST-1 raw material solution: 0.03 to 0.15 sccm

CT-1 raw material solution: 0.01 to 0.10 sccm

Bi (MMP)$_3$: 0.10 to 0.25 sccm

PET raw material solution: 0 to 0.16 sccm

Carrier Gas (for Respective Raw Materials)

Inert gas: 0.2 to 0.5 SLM

In the apparatus shown in FIG. 12, raw material solutions (95a, 95b, . . . ) are supplied into the gas passage 92 through five raw material supply ports 96, respectively, while the carrier gas 93 is passed to flow in the gas passage 92 to cause the carrier gas 93 to shear the raw material solutions, yielding the latter in the form of microfine particles. The microfine particles of the raw material solutions are dispersed in the carrier gas 93 to form a gas and liquid two phase flow. The gas and liquid two phase flow is cooled until it is introduced into the vaporizing tube 20 while maintaining a state of the gas and liquid two phases (Introduction of Oxidizing Gas)

An oxidizing gas may be introduced into the gas subsequent to the vaporization. It may be desirable, however, that oxidizing gas have been introduced in part or as a whole into the carrier gas before it is mixed with a raw material solution or solutions (i. before a gas and liquid two phase flow is formed), for the reason that this will sharply decrease the content of C in a film or films and, in turn, reduce the amount of leak.

Vaporizing

The vaporizing chamber has a temperature, preferably of 200 to 300° C. At a temperature less than 200° C. in the chamber, sufficient vaporization is not attained. On the other hand, if it exceeds 300° C., the tube walls are heated to a temperature that exceeds the decomposition temperature of, and will decompose, a raw material with the results of an unnecessary wear of the raw material and undesirable contamination of the MOCVD apparatus. From these standpoints, the temperature of the vaporizing chamber is preferably from 180 to 250° C.

Film Forming Chamber

A raw material as vaporized is introduced into a film forming chamber. The vaporized raw material is caused to react on a surface of a substrate to form a ferroelectric film. In this case, it is desirable that oxygen for reaction be supplied at a position of 50 cm to 60 cm upstream of the film forming chamber. The amount of reaction oxygen supplied is preferably from 0.5 SLM to 2.6 SLM.

The substrate in the film forming chamber has a temperature preferably from 330 to 750° C.

If it is less than 330° C., a complex is not sufficiently decomposed. If the temperature exceeds 750° C., formation of an oxide film on the substrate surface is not made negligible.

If the temperature is less than 330° C., the complex will insufficiently be decomposed. If it exceeds 750° C., forming of an oxide film on the substrate surface cannot be neglected.

The film forming chamber has a pressure therein preferably from 300 to 600 Pa.

4. Forming a Conductor 4

The conductor 4 is composed preferably, for example, of platinum (Pt), ruthenium (Ru) or iridium (Ir) as a novel metal or an oxide thereof. The conductor may be formed by vapor deposition by electron beam heating, or sputtering, as its typical forming technique. Also, MOCVD is applicable.

5. Step of Heat Treatment

The first ferroelectric is subjected to heat treatment for crystallization or poly-crystallization. The heat treatment is timed, following four cases mentioned below, at least one of which is performed.

(1) Heat treatment during Step 3 (forming a first ferroelectric);

(2) Heat treatment after Step 3 (forming the first ferroelectric) and in a furnace same as that of the apparatus for forming a first ferroelectric or in a separate vacuum chamber; and (3) Heat treatment after Step 3 (forming the first ferroelectric) and before Step 4 (forming a conductor 4), and in an annealing furnace.

(4) Heat treatment after Step 4 (forming the conductor 4) and in the annealing furnace.

If the first ferroelectric is an SCBT, heat treatment for crystallization or poly-crystallization is effected at a temperature preferably from 700 to 900° C., and more preferably from 740 to 830° C.

In this step of heat treatment, if the semiconductor 1 is a substrate of silicon, a surface thereof under supply of oxygen may have silicon oxide caused to grow on the surface. Then, if nitrogen element is added to the insulator 2, the nitrogen element added acts to limit movement of oxygen so that silicon oxide if caused to grow may have its thickness held small.

Zealous investigations by the inventor have proceeded to the present invention of a method of making a fine or microfine ferroelectric device such as an MFIS or MFS as well as a microfine ferroelectric device made by the method in which film forming of the microfine ferroelectric that is mainly composed of an SCBT is a core technique. As a typical example of the microfine ferroelectric device, mention is made of a ferroelectric field effect transistor as shown in FIG. 1. In FIG. 1, an end A of the source region 5 is preferably positioned inside of a transistor channel (a region between points C and F) from the intersecting point C of an extension of a side B of the gate electrode 4 and the surface of the semiconductor 1. Likewise, an end D of the drain region 6 is preferably positioned inside of the transistor channel from the intersecting point F of an extension of an opposite side E of the gate electrode 4 and the surface of the semiconductor 1.

In Examples 1 to 5 in which the gate electrode 4 has a length (gate length) as large as 10 micrometers, it was possible to use a Si substrate formed in advance with the source and drain regions 5 and 6. In a microfine transistor, however, of which the gate length is so short as to approach a mask matching precision of an optical or an electron beam aligner used in a step of photo-lithography, it may happen that either one of the end A of the source region 5 and the end D of the gate region 6 may be outside of the transistor channel with the result that a surplus resistance component is included in characteristics between the source and gate electrodes, impairing the transistor property substantially.

To avoid this, it has been found to be effective in making a microfine transistor to form a gate electrode in a self-alignment manner. Examples 6 to 10 show embodiments of making a microfine ferroelectric device with the gate electrode formed in self-alignment manner. In making a microfine ferroelectric device, damages by etching or ion implantation on a gate stack which are largely affected thereon makes it difficult to make a ferroelectric device that is of good quality. After zealous investigations, it has been found that good results are obtained by providing the formed gate stack with a layer of second ferroelectric so as to be made laterally in contact with side faces of the gate stack, coating the layer of second ferroelectric with a protective layer of an insulator having a dielectric constant not more than 10, and thereafter effecting heat treatment for crystallization or poly-crystallization of the first ferroelectric. The second ferroelectric though not intentionally limited to any is especially preferred if it is identical in kind or type of material to the first ferroelectric.

Figure 14:
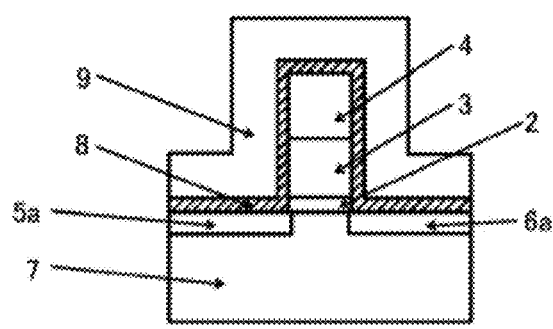
FIG. 14 is a conceptual structural view illustrating in cross section a ferroelectric device according to the present invention.
Figure 20:
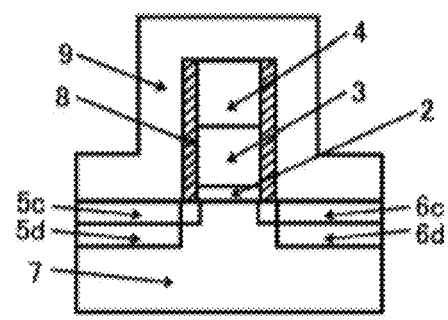
FIG. 20 is a conceptual structural view illustrating in cross section a ferroelectric device according to the present invention.

Hereinafter, mention is summarily made of a method of making a ferromagnetic device according to the present invention, in connection with cross-sectional views of devices illustrated in FIGS. 14, 17b and 20. FIGS. 14, 17, and 20 correspond to Examples 6 and 7, Example 8, and Example 9, respectively. FIG. 14 also corresponds to Example 10 which is for a lateral wall layer 8 that is as thin as 8 nm.

First, a summarized description is given of a method of making a ferroelectric device whose conceptual structure is shown in cross section in FIG. 14.

1. Surface Treatment of a Semiconductor

A semiconductor 1 prepared undergoes a surface treatment. For example, the surface treatment of semiconductor 1 described above is adopted in a method for making a microfine ferroelectric field effect transistor, too. Here, the semiconductor 1 may be a thin film of poly-crystalline silicon, may be a substrate of mono-crystalline silicon, may be that of germanium, may be that of mixed crystal of silicon and germanium, or may be that of Sic or GaAs, and its kind is not a limitation. Further, the semiconductor substrate may be substituted by an SOI (silicon on insulator) substrate.

2. Forming an Insulator 2

For example, forming an insulator 2 as described above is adopted in the method for making a microfine ferroelectric field effect transistor, too.

3. Forming a First Ferroelectric

For example, forming a first ferroelectric 3 in accordance with a method such as MOCVD or PLD technique as mentioned above is adopted in the method for making a microfine ferroelectric field effect transistor, as well.

4. Forming a Conductor 4

Electron beam deposition, sputtering or MOCVD technique as described above is adopted in the method for making a microfine ferroelectric field effect transistor, as well. The conductor 4 may be of any material which has good conductivity. It may be a metal such as Au, Pt, Ir or Ru, may be a nitride such as TiN or TaN, or an oxide such as $IrO_2$ or $RuO_2$. It may also be a laminate of layers Pt, TiN and Ti, or Ire and Ir, or the like.

5. Forming a Gate Mask

A gate mask is formed on a conductor 4 by optical exposure or electron beam graphics or its subsequent development.

6. Gate Etching

Figure 22:
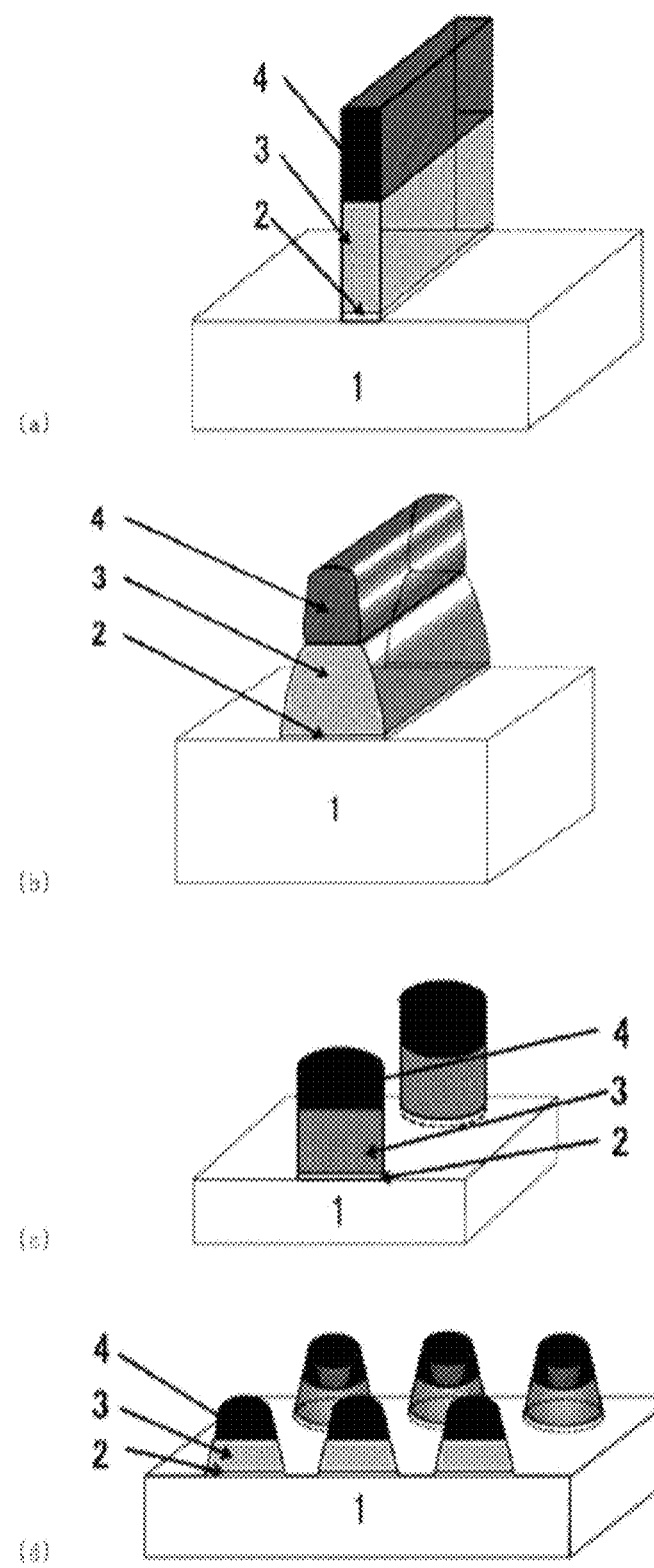
FIG. 22 is a conceptual structural view illustrating in cross section a gate stack in a ferroelectric device according to the present invention.

An etching technique such as reactive ion etching (RIE) or ion milling is used to remove a portion not coated with the gate mask from up to down in the order of the conductor 4, the first ferroelectric 3 and the insulator 2, thereby exposing a surface or surfaces of the semiconductor 1. By this method, it is possible to form a gate stack or gate stacks on the semiconductor 1. Such a, or. each gate stack presents a cross section as shown in FIGS. 22(a), 22(b) and 22(c). The gate stack if it is high in anisotropy and ideal, is shaped in the form of a prism. Actually, through the actual etching during which the mask may recede from or may have a secondary product adhered to the side faces so that side faces may be tapered as shown FIG. 22(b), or a bulge, recess or discontinuous differences in level may be left so that the sides may be rounded. Further, if ferroelectric devices are highly integrated and arranged more in closeness as they are finer and finer, the distance between one gate stack and an adjacent gate stack, each of which as shown, e g. in FIG. 22(*c*) is rounded in side by micromachining, may approach its occupied base area. Such gate stacks highly integrated may be seen in, e. g. FIG. 22(*d*).

7. Ion Implantation

Figure 4:
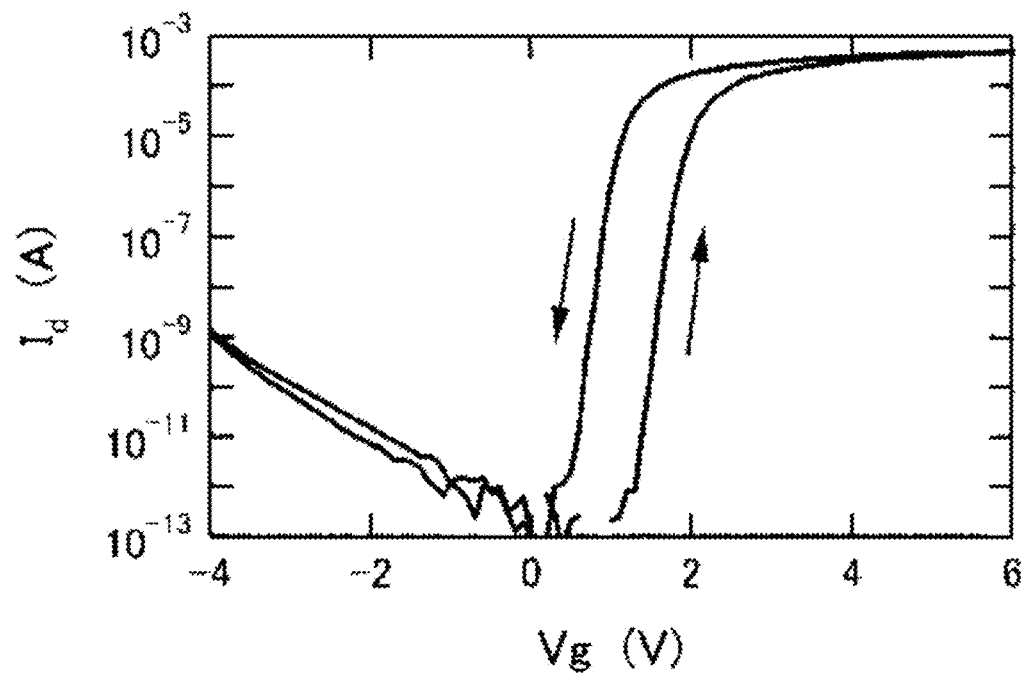
FIG. 4 is a graph illustrating a relationship between a gate voltage and a drain current in Example 2.

Each portion of the exposed surface area on the semiconductor 1 is doped with impurity by ion implantation to form a source region and a drain region shown in FIG. 4 at 5*a* and 6*a*, respectively.

Removing the Gate Mask

The gate mask as a residue after etching if it is composed of an organic material is removed by ashing in oxygen plasma, or cleansing with an organic solvent such as acetone. It is also possible that during the gate etching mentioned above, the gate mask as a result may totally disappear automatically. The step of removing the gate mask as a residue after etching can be performed immediately after the step of the gate etching. In this case, the conductor 4 in the step of ion implantation serves to prevent ions from entering into the layer of first ferroelectric.

9. Forming a Lateral Wall Layer of Second Ferroelectric

In the step of gate etching mentioned above, an etching damage is caused to occur on side faces of the gate stack. More specifically, there occur re-attachment of an etched material onto the side faces of the gate stack in an ion milling process. With an RIE technique, a secondary product of reactive gas and material for etching is produced on the side faces of the gate stack and surfaces of the semiconductor 1.

Also, in the step of ion implantation mentioned above, accelerated ions are injected to a degree into the walls faces of the gate stack, giving rise to a damage thereon by ion implantation.

Thus, the side faces of the gate stack undergo damage by etching or ion implantation. And, a proportion in volume of a portion of the side faces to the gate stack is increased in a ferroelectric device made as finer as having a gate length e. g. of 200 nm or less, where such damage by etching or ion implantation is more influential actually on the product quality, making it difficult to make a ferroelectric device of good or an acceptable quality. After zealous investigations by the inventors, it has been found that good results are brought about if a lateral wall layer 8 of second ferroelectric is provided in contact with the side surfaces of a gate stack. The second ferroelectric may be selected without limitation.

Made in contact with the side faces of a gate stack, it has been found that a lateral wall layer 8 of a ferroelectric mainly composed of SCBT as an oxide of strontium, calcium, bismuth and tantalum brings about good results. Over a gate stack after it, for example, is formed by etching, a layer of ferroelectric mainly composed of an SCBT is formed by an MOCVD technique to have a thickness preferably of 100 nm or less, more preferably of 10 nm or less. The MOCDV technique is characterized by step coating capability as a technique that makes it possible to attach a thin layer evenly over a surface that is much corrugated having a plurality of gate stacks rising on the semiconductor 1, and suitable as a method of forming a lateral wall layer 8.

10. Forming a Protective Insular Layer 9 with Dielectric Constant of 10 or Less.

After forming a ferroelectric mainly composed of SCBT by the MOCVD technique, it is possible to further build-up an insulator as a protective layer such as silicon oxide and aluminum oxide. If a high speed operation of the microfine ferroelectric field effect transistor is viewed important, it is seen that proving an insulator such as silicon oxide or aluminum oxide having a relatively low dielectric constant of 10 or less serves effectively to lower the capacitance of insulator for the purposes of separating between elements of ferroelectric field effect transistor. Silicon oxide or aluminum oxide can be built up simply by a sputtering or otherwise by a MOCVD or a MOD technique.

11. Step of Heat Treatment

Thermal heat treatment is performed to effect crystallization or poly-crystallization of the first ferroelectric.

After the steps 1 to 11 are accomplished, then after through steps of forming a contact hole for a gate electrode and forming a hole for gate and drain electrodes, electrical characteristics of the microfine ferroelectric device, here a ferroelectric field effect transistor, can be measured. The microfine ferroelectric device made according to the method of making mentioned above is shown in FIG. 14 of a cross section of its conceptual structural view.

The lateral wall layer 8 of the microfine ferroelectric device has a physical film thickness of 100 nm or less, preferably 10 nm or less. If these microfine or micronized ferroelectric devices are enhanced in integration and very closely arranged, of a laminate of the lateral wall and protective layers 8 and 9, namely the insulator which assumes the role of separating elements between the adjacent devices, the lateral wall layer can be thinned relative to the protective layer 9 to lower the dielectric constant and, hence, to increase an equivalent $SiO_2$ (oxide) thickness, thereby preventing data miswriting or writing in error between adjacent devices.

Figure 17:
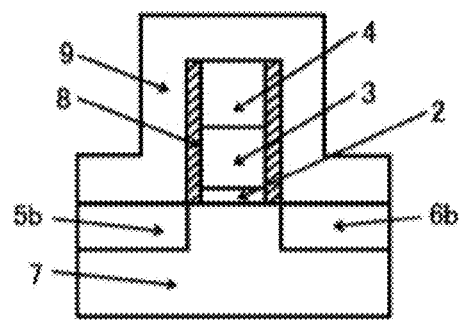
FIG. 17 is a conceptual structural view illustrating in cross section a ferroelectric device according to the present invention.

Further, as an implementation in which the timing is altered of forming a second ferroelectric, viz. a lateral wall layer 8, and ion implantation, a method is described in brief of making a ferroelectric device having a structure shown as its conceptual cross sectional view in FIG. 17. At the outset, a method as of making a microfine ferroelectric device having a structure as shown in FIG. 14 is used to form a gate stack on a semiconductor 1. To be a lateral wall 8, a layer of ferroelectric composed mainly of SCBT is formed by MOCVD over side faces of the gate stack, exposed surfaces of the semiconductor 1 and a surface of the conductor 4, whereafter a portion of the ferroelectric is removed by anisotropic etching, e. g. in a RIE or ion milling technique and under conditions such that etching proceeds faster in a direction parallel to the side faces of the gate stack, until the surface of the semiconductor 1 are re-exposed. Since in the MOVCD process the ferroelectric is built up sufficiently on the side faces of the gate stack, after conclusion of this step of removal a lateral wall layer of ferroelectric 8 is selectively left on the side faces of the gate stack.

Then, the semiconductor 1 is doped on the exposed surfaces with impurity by an ion implantation technique to form the source region (5*b* in FIG. 17) and the drain region (6*b* in FIG. 17). Over whole surfaces thereon, an insulator such as silicon oxide or aluminum oxide is built up as a protective layer 9 of the insulator having a dielectric constant of 10 or less. After heat treatment is performed to crystalize or poly-crystalize the first ferroelectric, then after through steps of forming a contact hole for a gate electrode and forming a hole for gate and drain electrodes, a ferroelectric device, here a ferroelectric field effect transistor as shown in FIG. 17, that is good in high speed operability, and its electrical characteristics can be measured. The impurity doped into the semiconductor 1 to form the source region (5*b* in FIG. 17) and the drain region (6*b* in FIG. 17) reaches near the end of the lateral wall 8 outside of the side faces of the gate stack immediately after ion implantation. By undergoing the heat treatment, the impurity doped into the semiconductor 1 is caused to diffuse. Since the lateral wall layer 8 left selectively on the side faces of the gate stack is sufficiently thin, an excessive resistance component is not included between the source and drain after the diffusion.

Also, as another implementation in which the timing is altered of forming a second ferroelectric, viz. a lateral wall layer 8, and ion implantation, a method is described in brief of making a ferroelectric device having a structure shown as its conceptual cross sectional view in FIG. 20.

First, a method as of making a microfine ferroelectric device having a structure as shown in FIG. 20 is used to form a gate stack on a semiconductor 1 and, thereafter, the semiconductor 1 are doped shallowly on its exposed surfaces with impurity to form shallow source and drain regions (5c and 6c in FIG. 20). The depth of this doping can be controlled mainly by the magnitude of energy of acceleration in the ion implantation. Over side faces of the gate stack, the exposed surfaces of the semiconductor 1 and a surface of the conductor 4, a lateral wall layer 8 of ferroelectric composed mainly of SCBT is formed by the MOCVD technique and, thereafter, the ferroelectric is removed by anisotropic etching e. g. in s RIE or ion milling process such that etching proceeds faster in a direction parallel to the side faces of the gate stack until the surfaces of the semiconductor 1 are re-exposed. Since in the MOVCD process the ferroelectric is built up sufficiently on the side faces of the gate stack as mentioned above, after conclusion of this step of removal a lateral wall layer of ferroelectric 8 is selectively left on the side faces of the gate stack.

Then, the semiconductor 1 are doped on its exposed surfaces 5d and 6d in FIG. 20 with impurity to form shallow source and drain regions which are deeper than those 5c and 6c in FIG. 20. Over whole surfaces thereon, an insulator such as silicon oxide or aluminum oxide is built up as a protective layer 9 of the insulator having a dielectric constant of 10 or less. After heat treatment is performed to crystalize or poly-crystalize the first ferroelectric, then after through steps of forming a contact hole for a gate electrode and forming a hole for gate and drain electrodes, a ferroelectric device, here a ferroelectric field effect transistor as shown in FIG. 20, that is good in high speed operability and has the effect of limiting an increase of leakage current between the source and drain regions as brought about by their approaching one another as the gate length is made smaller, and its electrical characteristics can be measured.

EMBODIMENTS

Example 1

In Example 1 as an embodiment of the present invention, a transistor structured as shown in FIG. 1 is made.
Materials used, thicknesses and others are as follows:
Semiconductor 1 constituted by a Si substrate having a source and a drain region preformed.
Insulator 2 composed of $HfO_2$, and having a thickness of 7 nm.
First Ferroelectric, i.e. Ferroelectric 3 composed of SCBT and having a thickness of 200 nm
Conductor 4 composed of Pt and having a thickness of 200 nm.
Gate length (length of gate metal from the source region towards the drain region) of 10 μm Type of conduction of the source and drain regions 5 and 6: n type
Type of conduction of region 7: p type
$HfO_2$ is formed as built up by pulse laser deposition. The laser used is KrF excimer laser. Laser excimer is of 250 mJ per pulse and a repetition frequency of pulses: 2 Hz. The substrate has a temperature of 220° C. Gas introduced into a build-up chamber is nitrogen gas and has a pressure therein of 0.11 torr (14.7 Pa).
A ferroelectric 3 of SCBT is formed by a MOCVD apparatus as shown in FIG. 12.
Liquid Materials
ST-1 (concentration of 0.1 M): 0.088 sccm
CT-1 (concentration of 0.1 M): 0.041 sccm
Bi $(MMP)_3$: (concentration of 0.2 M): 0.122 sccm
PET (concentration of 0.1 M): 0.032 sccm
* solvent: ECH
Substrate temperature: 360° C.
Pressure in Film Forming Chamber: 400 Pa
Oxidizing gas: oxygen, 1.8 SLM
Film Forming Time Period: 1748 seconds
Where the composition ratio of a film formed of SCBT by the MOCVD technique is analyzed by Rutherford backscattering spectrometry (RBS), it has been found that the composition ratio of strontium and calcium in SCBT of the formed film is substantially equal to the ratio of flows of ST-1 and CT-1 which are liquid materials of MOCVD. If the ratio of strontium and calcium of ferroelectric 3 in this Example is expressed by 1−x:x, then x=0.32.

After Pt as a conductor 4 is built up by electron beam vapor deposition, a portion of Pt which is unneeded is removed by photolithography and ion beam etching to form the gate electrode 4. After forming the gate electrode, heat treatment is had at a temperature of 800° C. for a time period of 30 minutes to crystalize the SCBT. A portion of layers of SCBT and $HfO_2$ is removed by photolithography and ion beam etching to form the source and drain electrodes for measurement.

[Measurement of Electrical Characteristics of Transistor]

The transistor in Example 1 has a dependency (Id–Vg characteristic) of drain current Id on gate voltage Vg. A drain voltage Vd=0.1 V is applied to the drain electrode, a source voltage Vs to the source electrode, and a substrate voltage Vsub to the substrate electrode. Under Vs=Vsub=0 volt, the Id–Vg characteristic is measured. As is apparent from FIG. 2, a hysteresis curve peculiar to a MFIS transistor is seen from reciprocal sweep between −4 and 6 volts of the gate voltage Vg. A difference between the right and left hysteresis curves constitutes a memory window. A voltage value giving $I=2 \times 10^{-6}$ A is determined to be a threshold voltage. A difference between the threshold voltage on the left branch (curve on the left side of the annular hysteresis curve) and the right branch (curve on the right side of the annular hysteresis curve) is found to yield a memory window of 0.89 volts.

Figure 3:
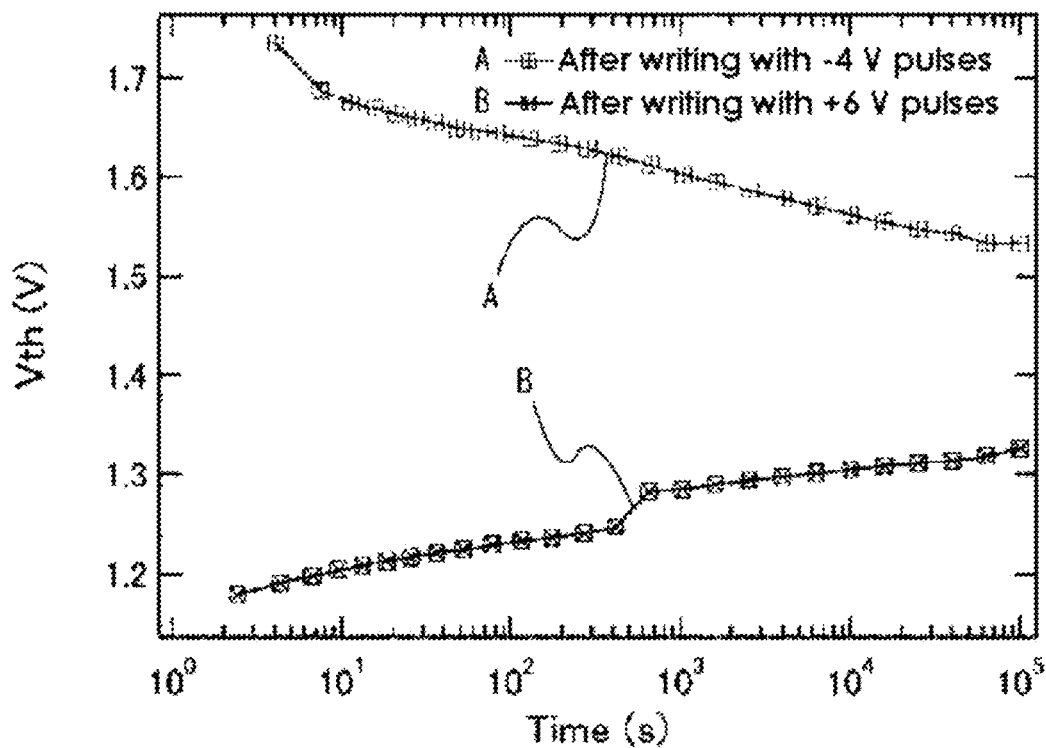
FIG. 3 is a graph illustrating a change of threshold voltage with lapse of time in Example 1.

Next, a data retention characteristic after writing two-valued data by application of pulsed voltage is sought. After a pulsed voltage of 6 V and 0.1 second is applied to the gate electrode at the time of writing a one-valued data, a reading operation is performed at a suitable time interval at the time of data retention, at which a retention voltage of 1.4 V is applied to the gate electrode. At the time of data reading, with Vd=0.1 V, Vg is swept between 1.1 and 2.1 V to measure Id. A voltage value at which $Id=10^{-6}$ A is determined to be a threshold voltage and is measured. The results are graphically shown by the corresponding curves on the lower side in FIG. 3. Next, after a pulsed voltage of −4 V and 0.1 second is applied to the gate electrode at the time of writing the other one-valued data, a reading operation is performed at a suitable time interval at the time of data retention, at which a retention voltage of 1.4 V is applied to the gate electrode. The same reading operation as above is performed to read a threshold voltage. The results are graphically shown by the corresponding curves on the upper side in FIG. 3. Two such threshold values corresponding to such binary values are found clearly distinguishable and upon drawing an extrapolation curve of the two curves it is seen that the difference between the threshold values will remain 0.1 V or more even after 10 years.

Example 2

Figure 2:
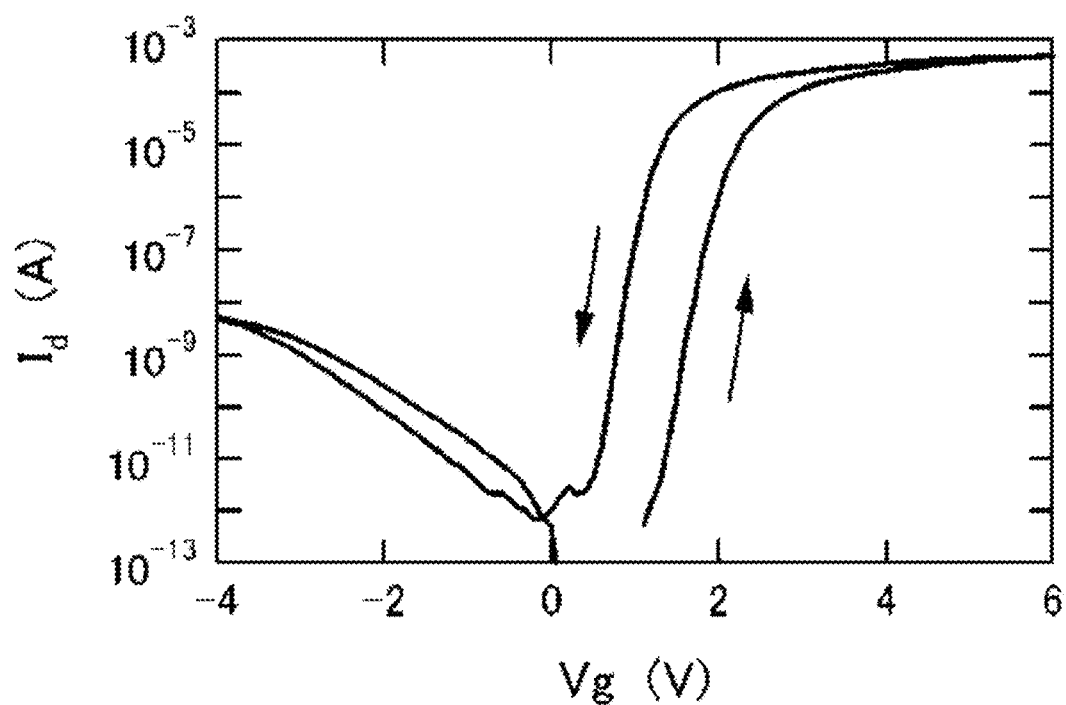
FIG. 2 is a graph illustrating a relationship between a gate voltage and a drain current in Example 1.

In Example 2, rates of flow of MOCVD liquid materials different from those in Example 1 are adopted. Also, the period of heat treatment for crystallization is altered. Other conditions are identical to those in Example 1. To with:
Liquid Raw Materials
ST-1 (concentration of 0.1 M): 0.106 sccm
CT-1 (concentration of 0.1 M): 0.049 sccm
Bi (MMP)$_3$: (concentration of 0.2 M): 0.146 sccm
PET (concentration of 0.1 M): 0.038 sccm
Film Forming Time Period: 1457 seconds
Heat Treatment Conditions: heat treatment in oxygen under the atmospheric pressure, at a temperature of 800° C. and for a time period of 60 minutes.
FIG. 4 shows Id–Vg characteristics. Measurement as is that in FIG. 2 is made in which the gate voltage is swept in reciprocation between −4 and 6 V. At Id=2×10$^{-6}$ A, a memory window of 0.84 V is had.

Example 3

Figure 5:
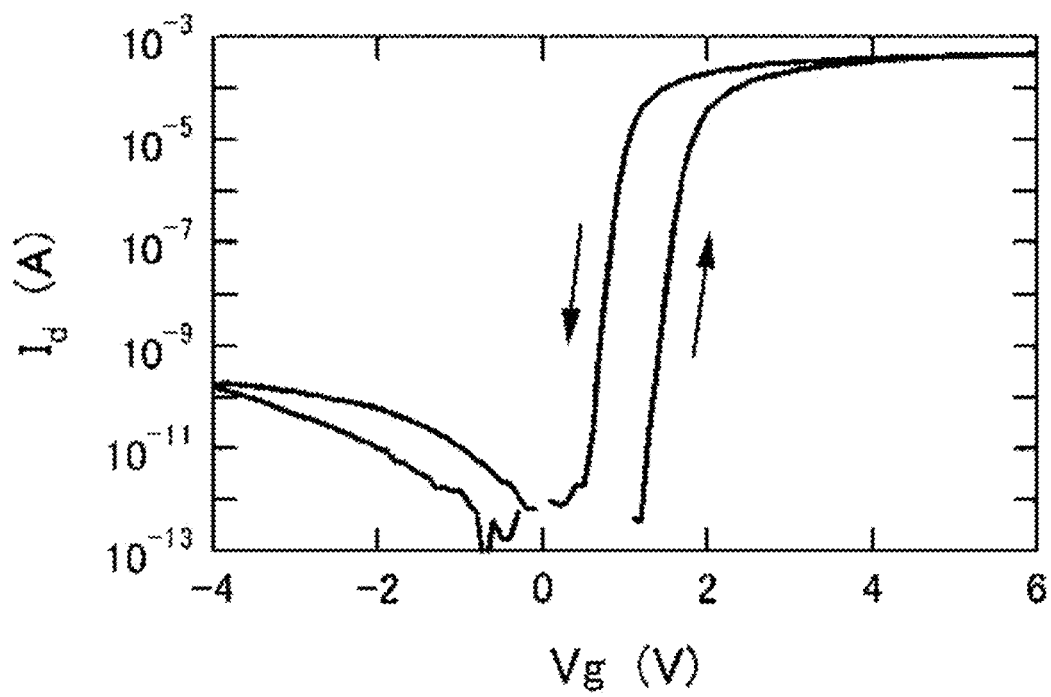
FIG. 5 is a graph illustrating a relationship between a gate voltage and a drain current in Example 3.

In this Example, a substrate temperature different from those in Examples 1 and 2 is used. Also, the rates of flow of MOCVD liquid materials and the period of heat treatment for crystallization are altered. Also, the time period of heat treatment for crystallization is 1 hour. Other conditions are identical to those in Example 1. To with:
Substrate Temperature: 450° C.
Liquid Raw Materials
ST-1 (concentration of 0.1 M): 0.097 sccm
CT-1 (concentration of 0.1 M): 0.032 sccm
Bi (MMP)$_3$: (concentration of 0.2 M): 0.140 sccm
PET (concentration of 0.1 M): 0.032 sccm
Film Forming Time Period: 1940 seconds
Heat Treatment Conditions: heat treatment in oxygen under the atmospheric pressure, at a temperature of 800° C. and for a time period of 30 minutes.
FIG. 5 shows Id–Vg characteristics. Measurement as is that in FIG. 2 is made in which the gate voltage is swept in reciprocation between −4 and 6 V. At Id=2×10$^{-6}$ A, a memory window of 0.75 V is had.

Example 4

Figure 6:
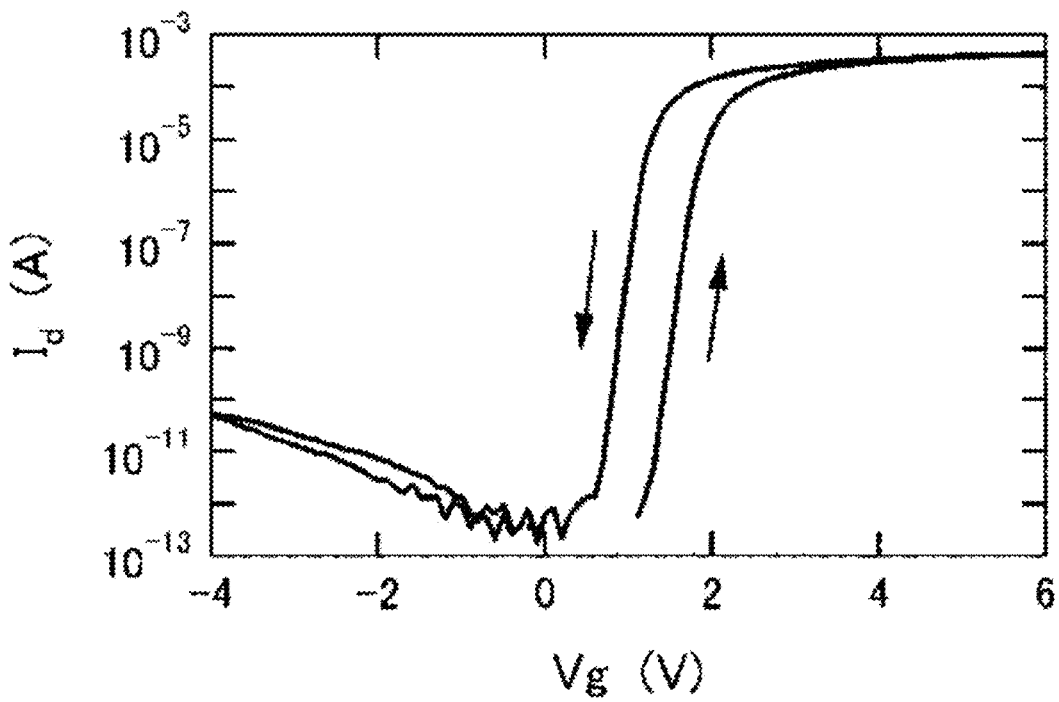
FIG. 6 is a graph illustrating a relationship between a gate voltage and a drain current in Example 4.

In this Example, different from Examples 1 to 3, the oxidizing gas comprises a mixed gas of oxygen and argon.
The rates of flow of MOCVD liquid materials and the film forming time period are altered. Also, the time period for heat treatment is 1 hour. The substrate temperature is 400° C. Other conditions are identical to those in Example 1. To with, they are as follows:
Oxidizing Gas: oxygen of 0.6 SLM and argon of 1.2 SLM
Substrate Temperature: 400° C.
Liquid Raw Materials
ST-1 (concentration of 0.1 M): 0.106 sccm
CT-1 (concentration of 0.1 M): 0.049 sccm
Bi (MMP)$_3$: (concentration of 0.2 M): 0.156 sccm
PET (concentration of 0.1 M): 0.028 sccm
Film Forming Time Period: 1700 seconds
Heat Treatment Conditions: heat treatment in oxygen under the atmospheric pressure, at a temperature of 800° C. and for a time period of 30 minutes.
It should be noted that a thin film of SCBT formed has a thickness of 240 nm.
FIG. 6 shows Id–Vg characteristics. Measurement as is that in FIG. 2 is made in which the gate voltage is swept in reciprocation between −4 and 6 V. At Id=2×10$^{-6}$ A, a memory window of 0.67 V is had.

Example 5

Figure 7:
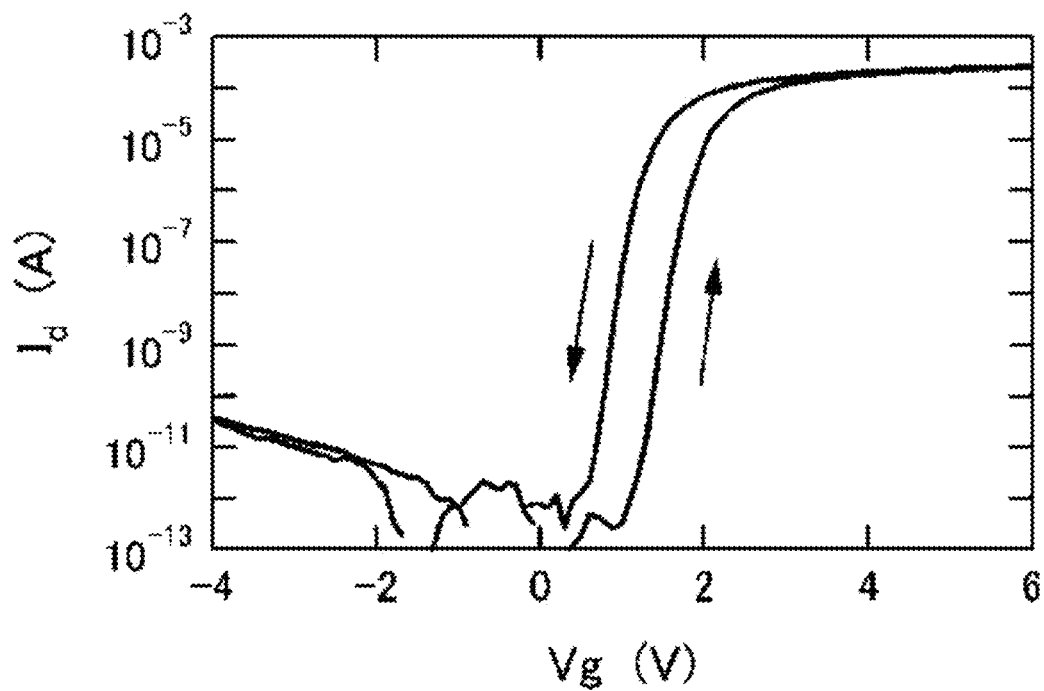
FIG. 7 is a graph illustrating a relationship between a gate voltage and a drain current in Example 4.

In Example 5, the rates of flow of MOCVD liquid materials are adopted so that Ca and Sr may have an equal composition ratio, and the film forming time period is altered. Other conditions are identical to those in Example 1. To with:
Liquid Raw Materials
ST-1 (concentration of 0.1 M): 0.064 sccm
CT-1 (concentration of 0.1 M): 0.065 sccm
Bi (MMP)$_3$: (concentration of 0.2 M): 0.122 sccm
PET (concentration of 0.1 M): 0.032 sccm
Film Forming Time Period: 1750 seconds
Heat Treatment Conditions: heat treatment in oxygen under the atmospheric pressure, at a temperature of 800° C. and for a time period of 30 minutes.
FIG. 7 shows Id–Vg characteristics. Measurement as is that in FIG. 2 is made in which the gate voltage is swept in reciprocation between −4 and 6 V. At Id=2×10$^{-6}$ A, a memory window of 0.62 V is had.

Comparative Example

Figure 8:
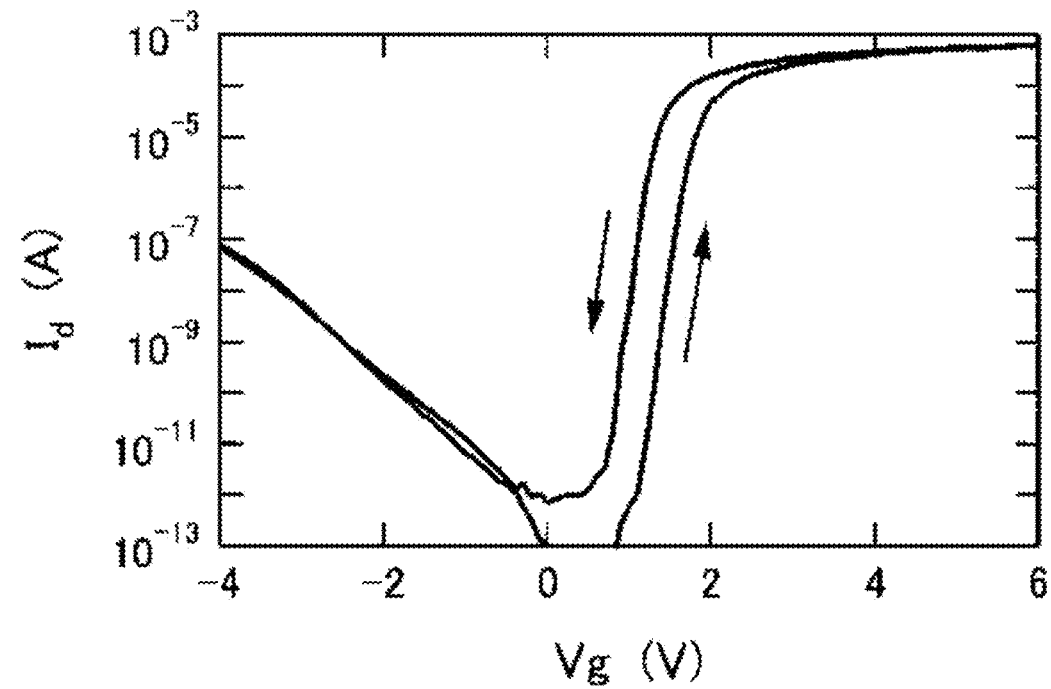
FIG. 8 is a graph illustrating a relationship between a gate voltage and a drain current in Example 1.

In this Example, a ferroelectric of SBT is formed.
Use is made of the following liquid materials.
In other respects, it is identical to Example 1.
Liquid Materials
ST-1 (concentration of 0.1 M): 0.129 sccm
Bi (MMP)$_3$: (concentration of 0.2 M): 0.130 sccm
PET (concentration of 0.1 M): 0.032 sccm
*solvent: ECH
Film Forming Time Period: 1664 seconds
FIG. 8 shows Id–Vg characteristics. Measurement as is that in FIG. 2 is made in which the gate voltage is swept between −4 and 6 V. At Id=2×10$^{-6}$ A, a memory window of 0.46 V is had.

Example 6

Examples 6 and 7 relate to making a ferroelectric field effect transistor structured as shown in FIG. 14.
In Example 6, the ferroelectric field effect transistor is made using steps as followed:
1. Surface Treatment of Semiconductor 1
Cleaning of Si Substrate: It is immersed in buffer HF for removal of its surface oxide film and is then cleansed with ultrapure water.
2. Forming of Insulator 2:
Build-Up or Deposition of Insulator Buffer Layer:
Deposition Method: PLD technique
Material: HfO$_2$ doped with nitrogen
Thickness: 7 nm
Substrate Temperature: 220° C.

3. Forming of First Ferroelectric or of First Ferroelectric 3

Ferroelectric Film Deposition:
Deposition Method: PLD technique
PLD Target Composition: $Sr_{0.8}Ca_{0.2}Bi_3Ta_2O_x$
Thickness: 150 nm
Substrate Temperature: 415° C.

Where the composition ratio of a film formed of SCBT by the PLD technique is analyzed by Rutherford backscattering spectrometry (RBS), it has been found that the composition ratio of strontium and calcium in SCBT of the formed film is substantially equal to the composition ratio of strontium and calcium in the PLD target.

4. Forming of Conductor 4
Gate Electrode Material Deposition:
Pt deposited of 150 nm thick by electron beam deposition 5. Forming of Gate Mask
Electron Beam Resist Application:
Resist material of SAL601H-SR7
Electron Beam Exposure and Post-Baking followed by
Development with NMD3 and
Cleansing with Ultrapure Water 6. Gate Etching
Etching of Gate Electrode Material Pt:
Etching Method: Ion beam etching (ion mulling) technique
Ion Species: $Ar^+$ ion
Accelerating Voltage: 1.1 kV
Etching of Ferroelectric and Insulator Buffer Layer
Etching Method: ICP high-density plasma type RIE technique
Etching Gas: Mixed gas of $BCl_3$ and Ar
Antenna RF Electric Power: 700 W
Bias Power: 400 W 7. Removal of Gate Mask
Residual Electron Beam Resist Removal: Implemented by Introducing oxygen and ICP high-density plasma type RIE technique 8. Ion Implantation:
Implanted Ion: $P^+$ ion
Accelerating Energy: 15 keV
Dosage: $1.5 \times 10^{14}$ $cm^{-2}$ 9. Forming of Second Ferroelectric, i.e. Lateral Wall Layer 8
Build-Up or Deposition of SCBT by MOCVD
Oxidizing Gas: oxygen of 1.8 SLM
Substrate Temperature: 360° C.
Liquid Materials:
ST-1 (concentration of 0.1 M): 0.088 sccm
CT-1 (concentration of 0.1 M): 0.041 sccm
Bi $(MMP)_3$: (concentration of 0.2 M): 0.122 sccm
PET (concentration of 0.1 M): 0.032 sccm
Film Forming Time Period: 300 seconds
Film Thickness: 28 nm 10. Forming of Protective Layer of Insulator with Dielectric Constant of 1 or Less
Build-up or Deposition of $SiO_2$ of 200 nm thick by RF magnetron Sputtering 11. Step of Heat Treatment
Heat Treatment: In oxygen under the atm. pressure, at 813° C. and for 30 minutes 12: Forming of Contact Hole
A gate contact hole is formed by photolithography and ion beam etching, Ti is deposited by electron beam deposition and photoresist is removed by lift-off technique.

A source and drain contact hole is formed by photolithography and ion beam etching, and then photoresist is removed.

The cross section of a ferroelectric field effect transistor having a gate length of about 150 nm, as made in Example 6, is observed by a scanning electron microscope.

Characterization of the Ferroelectric Field Effect Transistor Made in Example 6

Figure 9:
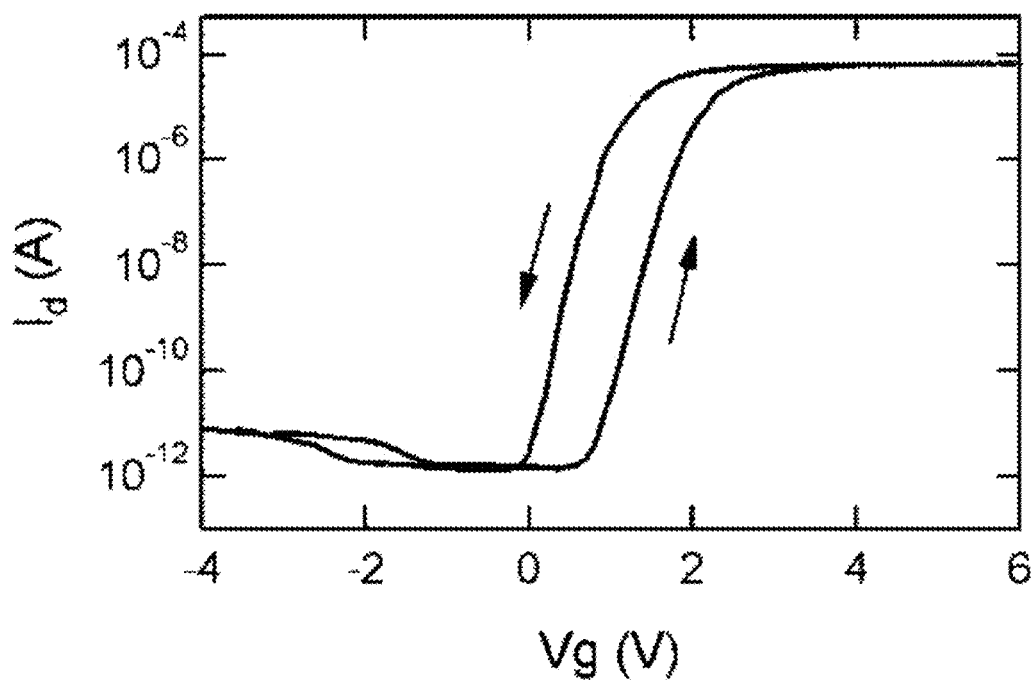
FIG. 9 is a graph illustrating a relationship between a gate voltage and a drain current in Example 6.
Figure 10:
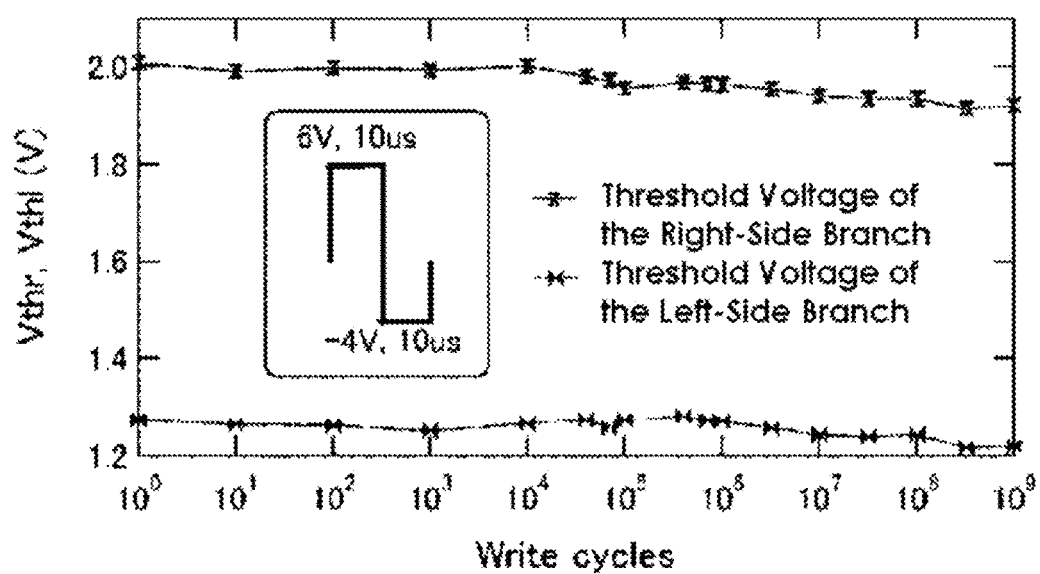
FIG. 10 is a graph illustrating results of test of multiple rewriting endurance in Example 6.

FIG. 9 shows $I_d$-$V_g$ characteristic of the transistor in which the gate voltage is swept in reciprocation between −4 and 6 V, yielding a memory window of 0.89 V at $Id=1\times10^{-7}$ A. FIG. 10 shows results of a rewrite count endurance test. A cycle of write pulses, i.e. a period of voltage wave in which pulses of positive polarity having a pulse height of +6 V and a pulse duration of 10 microseconds and pulses of negative polarity having a pulse height of −4 V and a pulse duration of 10 microseconds are continuously applied, is repetitively applied to the gate electrode while the source, drain and substrate voltage remain zero.

At a marker in the graph of FIG. 10, supply of write pulses is temporarily halted to measure $I_d$-$V_g$ characteristic under the condition of a drain voltage of 0.1 V. The gate voltage is swept in reciprocation between −4 and 6 V. A voltage at which a branch on the left side of the $I_d$-$V_g$ characteristic assumes $Id=1\times10^{-6}$ A is a threshold voltage ($V_{thl}$) of the left-side branch, and a voltage at which a branch on the right side of the $I_d$-$V_g$ characteristic assumes $Id=1\times10^{-6}$ A is a threshold voltage ($V_{thr}$) of the right-side branch. Upon ending of a reading operation, cyclic supply of writing pulses starts. $V_{thl}$ and $V_{thr}$ are counted until cycles of writing pulses supplied reach $10^9$ in number. From FIG. 10 it is seen that a rewriting endurance up to $10^9$ times is had.

Figure 11:
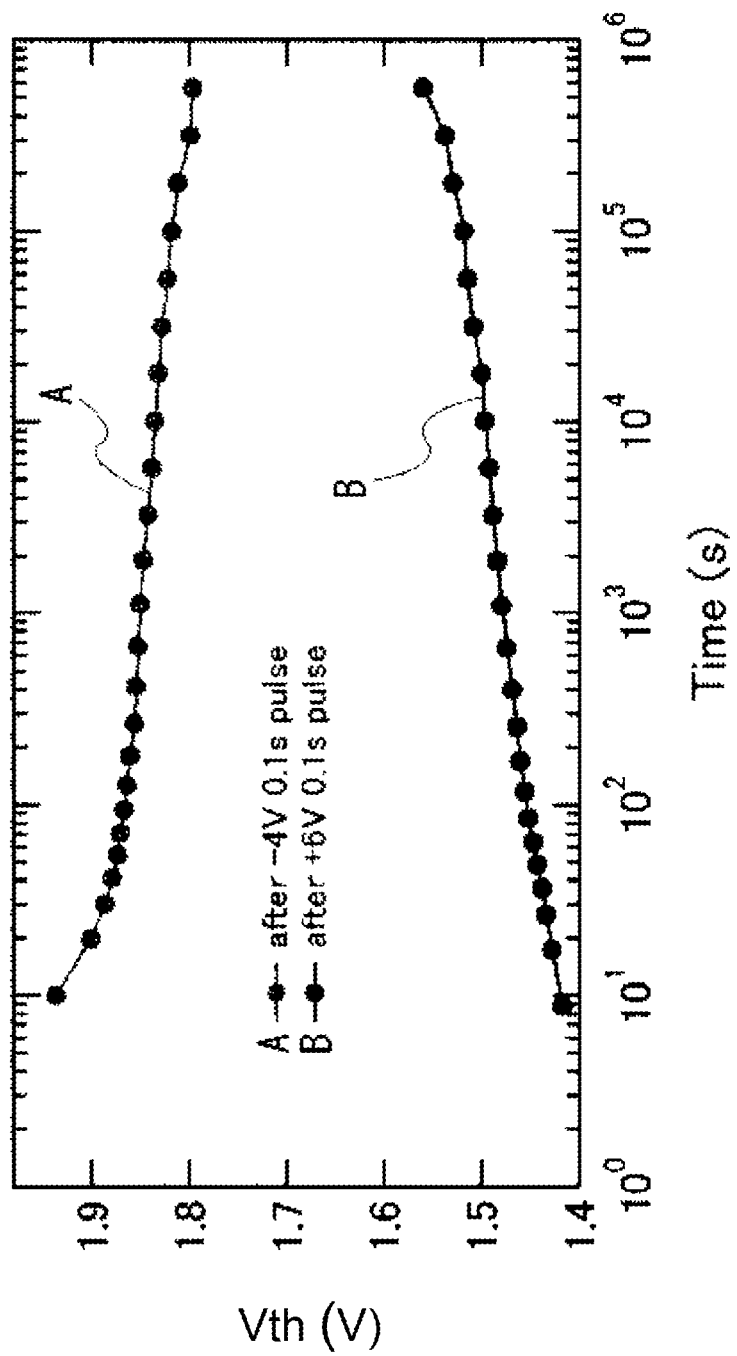
FIG. 11 is a graph illustrating results of test of data retention capability in Example 6.

FIG. 11 shows results of testing the data retention characteristic. After pulses of 0.1 second at 6 V are applied to the gate electrode, a data retention mode is entered in which reading operations are performed at suitable time intervals. At the data retention time, a retention voltage of 1.4 V is applied to the gate electrode. At the reading time, $V_g$ is swept in reciprocation between 1.0 and 2.1 V at $V_d$=0.1 V to measure $I_d$. A voltage value (threshold voltage) so that $I_d$=$10^{-5}$ A is read out. The results are shown by the lower curve in FIG. 9. Also, after pulses of 0.1 second at −4 V are applied to the gate electrode, a data retention mode is entered in which reading operations are performed at suitable time intervals. At the data retention time, a retention voltage of 1.4 V is applied to the gate electrode. By performing a reading operation as above, a threshold voltage is read out. The results are shown by the upper curve in FIG. 9. After a lapse of $6.3\times10^5$ seconds (about 1 week), these threshold values are sharply distinguished from each other.

Example 7

In Example 7 as an embodiment of the present invention, a ferroelectric field effect transistor structured as shown in FIG. 14 is made.

In this Example, the ferroelectric field effect transistor is made following the steps below.

1. Surface Treatment of Semiconductor
Si Substrate Cleaning: The substrate is immersed in buffer HF to remove a surface oxide film and then cleansed with ultrapure water.

2. Forming of Insulator 2
Deposition of Insulator Buffer Layer: Build-up by a PLD technique of $HfO_2$ of 7 nm thick doped with nitrogen.
Substrate Temperature: 220° C.

3. Forming of First Ferroelectric or of First Ferroelectric 3
  Ferroelectric Film Deposition: Build-up of SCBT of 150 nm thick by a PLD technique. The substrate has a temperature of 415° C.
4. Forming of Conductor 4
  Gate Electrode Material Deposition:
    Pt built up of 150 nm thick by electron beam deposition
5. Forming of Gate Mask
  Electron Beam Resist Application:
    Resist material of SAL601H-SR7
  Electron Beam Exposure and Post-Baking followed by Development with NMD3 and Cleansing with Ultra-pure Water
6. Gate Etching
  Etching of Gate Electrode Material Pt:
  Etching Method: Ion beam etching (ion mulling) technique
  Ion Species: Ar+ ion
  Accelerating Voltage: 1.1 kV
  Etching of Ferroelectric and Insulator Buffer Layer
  Etching Method: ICP high-density plasma type RIE technique
  Etching Gas: Mixed gas of $BCl_3$ and Ar
  Antenna RF Electric Power: 600 W
  Bias Power: 400 W
7. Removal of Gate Mask
  Residual Electron Beam Resist Removal: Implemented by Introducing oxygen and ICP high-density plasma type RIE technique
8. Ion Implantation:
  Implanted Ion: P+ ion
  Accelerating Energy: 10 keV
  Dosage: $1.0 \times 10^{14}$ $cm^{-2}$
9. Forming of Second Ferroelectric, i.e. Lateral Wall Layer 8
  Build-Up or Deposition of SCBT by MOCVD
  Oxidizing Gas: oxygen of 1.8 SLM
  Substrate Temperature: 360° C.
  Pressure of Film Forming Chamber: 400 Pa
  Liquid Materials:
  ST-1 (concentration of 0.1 M): 0.104 sccm
  CT-1 (concentration of 0.1 M): 0.025 sccm
  Bi $(MMP)_3$: (concentration of 0.2 M): 0.122 sccm
  PET (concentration of 0.1 M): 0.032 sccm
  Film Forming Time Period: 230 seconds
  Film Thickness: 22 nm
10. Forming of Protective Layer of Insulator with Dielectric Constant of 1 or Less
  Deposition of $SiO_2$ of 300 nm thick by RF magnetron sputtering
11. Step of Heat Treatment
  Heat Treatment: In oxygen under the atm. pressure, at 813° C. and for 30 minutes
12: Forming of Contact Hole
  A gate contact hole is formed by photolithography and ion beam etching, Ti is deposited by electron beam deposition and photoresist is removed by lift-off technique.
  A source and drain contact hole is formed by photolithography and ion beam etching, and then photoresist is removed.
  The cross section of a ferroelectric field effect transistor having a gate length of 140 nm, as made in Example 7 and machined by focused Ga ion beam, is observed by a scanning electron microscope.
  The structure is confirmed as shown in FIG. 14. The first ferroelectric, i.e. ferroelectric 3, film-formed by PLO and the second ferroelectric, i.e. lateral wall layer 8, formed by MOCVD, are of SCBT of the same kind and film-formed by different techniques, making it difficult for a scanning electron microscope to discriminate the boundary of the ferroelectric layer 3 and the lateral wall layer 8. Pt of the conductor 4 is seen as coated with SCBT and separated from $SiO_2$ of the protective layer 9.

Characterization of the Ferroelectric Field Effect Transistor made in Example 7

Figure 13:
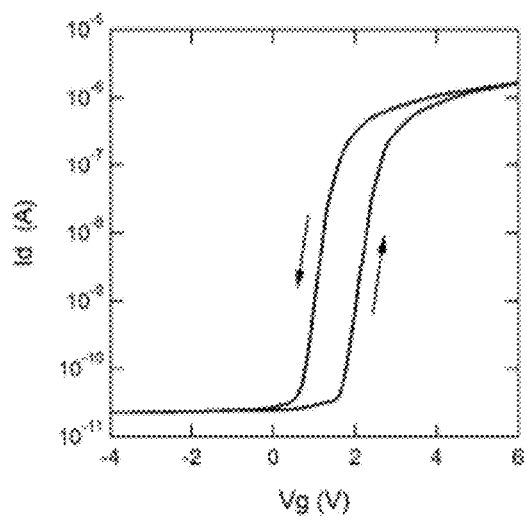
FIG. 13 is a graph illustrating a relationship between a gate voltage and a drain current in Example 7.

FIG. 13 shows an $I_d$–$V_g$ characteristic of the transistor. With the gate voltage swept in reciprocation between −4 and 6 V, a memory window of 0.98 is had (at $Id=1\times10^{-7}$ A). The other conditions taken having the $I_d$–$V_g$ characteristic are: a drain voltage of 0.1 V, a source voltage of 0 V and a substrate voltage of 0 V.

Example 8

In Example 8 as an embodiment of the present invention, a ferroelectric field effect transistor structured as shown in FIG. 17 is made.

In this Example, the ferroelectric field effect transistor is made following the steps below.
1. Surface Treatment of Semiconductor 1
  Si Substrate Cleaning: The substrate is immersed in buffer HF to remove a surface oxide film and then cleansed with ultrapure water.
2. Forming of Insulator 2
  Build-up of Insulator Buffer Layer: Deposition of $HfO_2$ of 7 nm thick doped with nitrogen, by a PLD technique. Substrate Temperature: 220° C.
3. Forming of First Ferroelectric or of Ferroelectric 3
  Ferroelectric Film Deposition: Deposition of SCBT of 150 nm thick by a PLD technique. The substrate has a temperature of 415° C.
4. Forming of Conductor 4
  Gate Electrode Material Deposition:
    Pt built up of 150 nm thick by electron beam deposition
5. Forming of Gate Mask
  Electron Beam Resist Application:
    Resist material of SAL601H-SR7
  Electron Beam Exposure and Post-Baking followed by Development with NMD3 and Cleansing with Ultra-pure Water
6. Gate Etching
  Etching of Gate Electrode Material Pt:
  Etching Method: Ion beam etching (ion mulling) technique
  Ion Species: Ar+ ion
  Accelerating Voltage: 1.1 kV
  Etching of Ferroelectric and Insulator Buffer Layer
  Etching Method: ICP high-density plasma type RIE technique
  Etching Gas: Mixed gas of $BCl_3$ and Ar
  Antenna RF Electric Power: 700 W
  Bias Power: 400 W
7. Removal of Gate Mask
  Residual Electron Beam Resist Removal: Implemented by Introducing oxygen and ICP high-density plasma type RIE technique
8. Forming of Second Ferroelectric, i.e. Lateral Wall Layer 8
  Deposition of SCBT by MOCVD
  Oxidizing Gas: oxygen of 1.8 SLM
  Substrate Temperature: 360° C.
  Liquid Materials:
  ST-1 (concentration of 0.1 M): 0.088 sccm CT-1 (concentration of 0.1 M): 0.041 sccm
Bi (MMP)$_3$: (concentration of 0.2 M): 0.122 sccm
PET (concentration of 0.1 M): 0.052 sccm
Film Forming Time Period: 520 seconds
Film Thickness: 53 nm Etching SCBT deposited or built up by the MOCVD technique Etching proceeds masklessly until the non-gate silicon surface is exposed. Etching is by an ICP high-density plasma type RIE technique. Etching gas is a mixed gas of BCl$_3$ and Ar. An antenna RF electric power of 600 W and a bias power of 300 W are used. With a MOCVD technique that excels in the ability to coat a stepped portion, SCBT on the gate lateral faces can be left after this step of etching.

9. Ion Implantation:
Implanted Ion: P$^+$ ion
Accelerating Energy: 15 keV
Dosage: $1.5 \times 10^{14}$ cm$^{-2}$ 10. Forming of Protective Layer of Insulator with Dielectric Constant of 10 or Less
A SiO$_2$ layer of 200 nm thick is deposited or built up by RF magnetron sputtering.

11. Step of Heat Treatment
Heat Treatment is effected in oxygen under the atm. pressure, at 813° C. and for 30 minutes.

12: Forming of Contact Hole
A gate contact hole is formed by photolithography and ion beam etching, Ti is deposited by electron beam deposition and photoresist is removed by lift-off technique.

A source and drain contact hole is formed by photolithography and ion beam etching, and then photoresist is removed.

The cross section of a ferroelectric field effect transistor having a gate length of 150 nm, as made in Example 8, is observed by a scanning electron microscope. By this observation it has been confirmed that the lateral wall layer 8 and protective layer 9 are left on the side faces of the gate stack.

Characterization of the Ferroelectric Field Effect Transistor Made in Example 8

Figure 15:
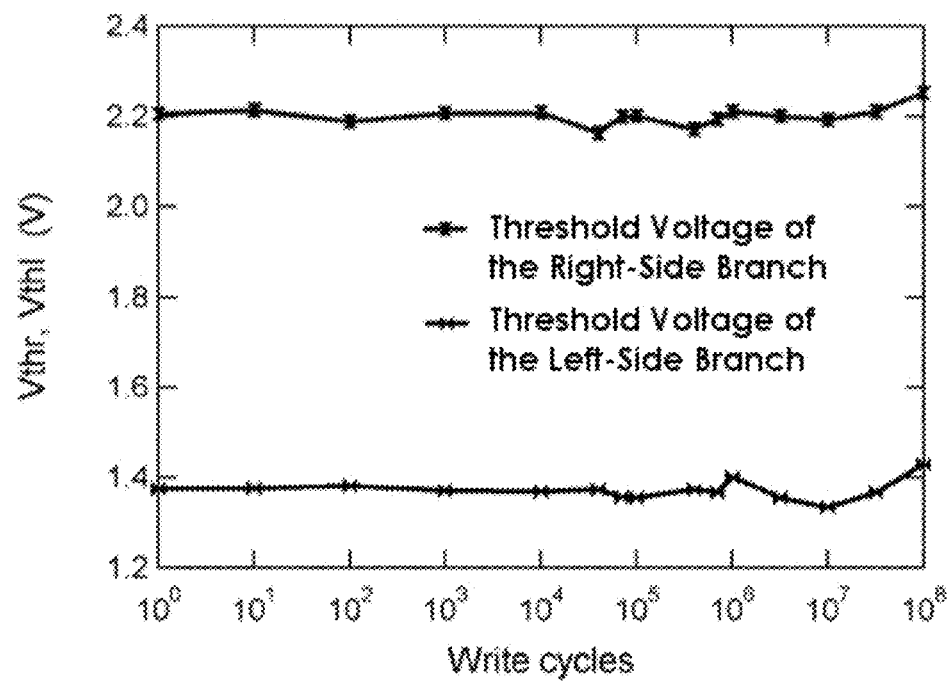
FIG. 15 is a graph illustrating results of test of multiple rewriting endurance in Example 8.

FIG. 15 shows results of a rewrite count endurance test of the transistor. A cycle of write pulses, i.e. a period of voltage wave in which pulses of positive polarity having a pulse height of +6 V and a pulse duration of 10 microseconds and pulses of negative polarity having a pulse height of −4 V and a pulse duration of 10 microseconds are continuously applied, is repetitively applied to the gate electrode while the source, drain and substrate voltage remain zero. At a marker in the graph of FIG. 15, supply of write pulses is temporarily halted to measure I$_d$-V$_g$ characteristic under the condition of a drain voltage of 0.1 V. The gate voltage is swept in reciprocation between −4 and 6 V. A voltage at which a branch on the left side of the I$_d$-V$_g$ characteristic assumes Id=1×10$^{-6}$ A is a threshold voltage (V$_{thl}$) of the left-side branch, and a voltage at which a branch on the right side of the I$_d$-V$_g$ characteristic assumes Id=1×10$^{-6}$ A is a threshold voltage (V$_{thr}$) of the right-side branch. Upon ending of a reading operation, cyclic supply of writing pulses starts. V$_{thl}$ and V$_{thr}$ are counted until cycles of writing pulses supplied reach 10$^9$ in number.

Figure 16:
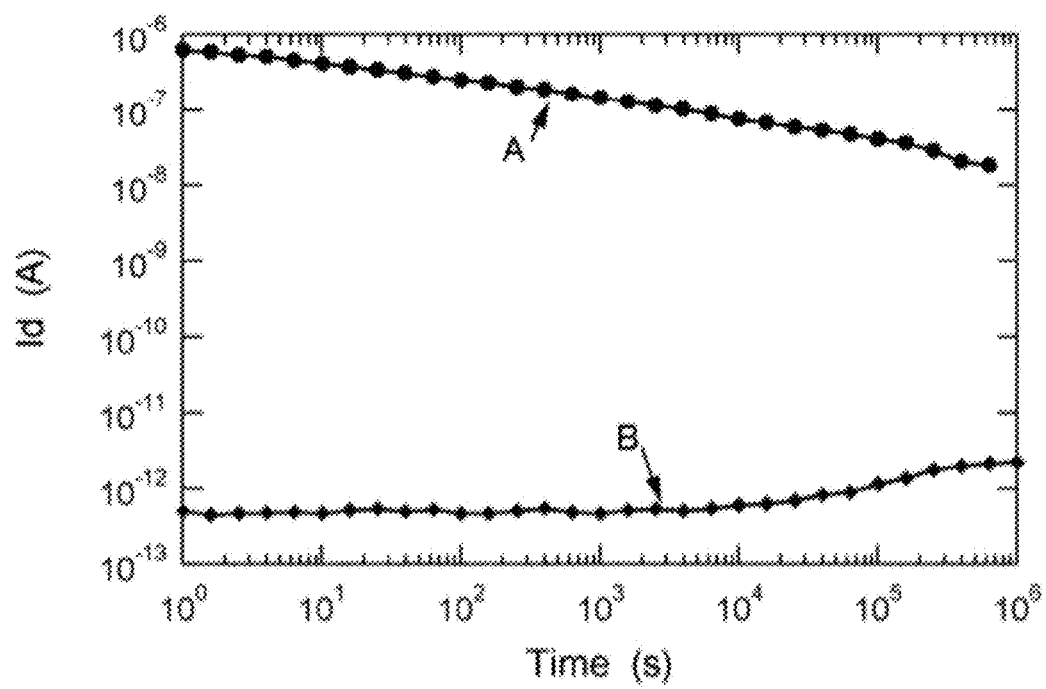
FIG. 16 is a graph illustrating results of test of data retention capability in Example 8.

From the Figure it is seen that a rewriting endurance up to 10$^9$ times is had. FIG. 16 shows results of testing the data retention characteristic. After pulses of 0.1 second at 6 V are applied to the gate electrode, a data retention mode is entered in which reading operations are performed at suitable time intervals. At the data retention time, a retention voltage of 1.0 V is applied to the gate electrode. At the reading time, a voltage of 1.3 V is applied to the gate electrode to measure I$_d$. The results are shown by the upper curve (an "on" state) in FIG. 16. Also, after pulses of 0.1 second at −4 V are applied to the gate electrode, a data retention mode is entered in which reading operations are performed at suitable time intervals. At the data retention time, a retention voltage of 1.0 V is applied to the gate electrode. In performing a reading operation as above, a voltage of 1.3 V is applied to the gate electrode at Vd=0.1 V to measure I$_d$. The results are shown by the lower curve (an "off" state) in FIG. 16. After a lapse of 6.3×10$^5$ seconds, viz. more than 1 week, these threshold values are sharply distinguished from each other.

Example 9

In Example 9 as an embodiment of the present invention, a ferroelectric field effect transistor structured as shown in FIG. 20 is made.

In this Example, the step of ion implantation is performed twice.

Main process steps are shown below.

1. Surface Treatment of Semiconductor
Si Substrate Cleaning: The substrate is immersed in buffer HF to remove a surface oxide film and then cleansed with ultrapure water.

2. Forming of Insulator 2
Deposition of Insulator Buffer Layer: Built up of HfO$_2$ of 7 nm thick doped with nitrogen, by a PLD technique.
Substrate Temperature: 220° C.

3. Forming of First Ferroelectric or of First Ferroelectric 3
Film Forming Method: PLD technique
PLD Target Composition: Sr$_{0.8}$Ca$_{0.2}$Bi$_3$Ta$_2$O$_x$
Film Thickness: 150 nm
Substrate Temperature: 415° C.

4. Forming of Conductor 4
Gate Electrode Material Deposition:
Pt deposited of 150 nm thick by electron beam deposition 5. Forming of Gate Mask
Electron Beam Resist Application:
Resist material of SAL601H-SR7
Electron Beam Exposure and Post-Baking followed by Development with NMD3 and Cleansing with Ultrapure Water 6. Gate Etching
Etching of Gate Electrode Material Pt:
Etching Method: Ion beam etching (ion mulling) technique
Ion Species: Ar$^+$ ion
Accelerating Voltage: 1.1 kV
Etching of Ferroelectric and Insulator Buffer Layer
Etching Method: ICP high-density plasma type RIE technique
Etching Gas: Mixed gas of BCl$_3$ and Ar
Antenna RF Electric Power: 700 W
Bias Power: 400 W 7. Removal of Gate Mask
Residual Electron Beam Resist Removal: Implemented by Introducing oxygen and ICP high-density plasma type RIE technique 8. Ion Implantation 1 (First Ion Implantation)
Implanted Ion: P$^+$ ion
Dosage: $10 \times 10^{13}$ cm$^{-2}$
Accelerating Energy: 10 keV 9. Forming of Second Ferroelectric, i.e. Lateral Wall Layer 8
  Deposition of SCBT by MOCVD
  Oxidizing Gas: oxygen of 1.8 SLM
  Substrate Temperature: 360° C.
  Liquid Materials:
  ST-1 (concentration of 0.1 M): 0.088 sccm
  CT-1 (concentration of 0.1 M): 0.041 sccm
  Bi (MMP)$_3$: (concentration of 0.2 M): 0.122 sccm
  PET (concentration of 0.1 M): 0.052 sccm
  Film Forming Time Period: 520 seconds
  Film Thickness: 51 nm
  Etching SCBT deposited or built up by the MOCVD technique
  Etching proceeds masklessly until the non-gate silicon surface is exposed. Etching is by an ICP high-density plasma type RIE technique. Etching gas is a mixed gas of BCl$_3$ and Ar. An antenna RF electric power of 600 W and a bias power of 300 W are used. With a MOCVD technique that excels in the ability to coat a stepped portion, SCBT on the gate lateral faces can be left after this step of etching.
10. Ion implantation 2 (Second Ion Implantation)
  Implanted Ion: P$^+$ ion
  Accelerating Energy: 15 keV
  Dosage: $1.5 \times 10^{14}$ cm$^{-2}$
11. Forming of Protective Layer of Insulator with Dielectric Constant of 1 or Less
  A SiO$_2$ layer of 200 nm thick is deposited or built up by RF magnetron sputtering.
12. Step of Heat Treatment
  Heat Treatment is effected in oxygen under the atm. pressure, at 813° C. and for 30 minutes.
13: Forming of Contact Hole
  A gate contact hole is formed by photolithography and ion beam etching, Ti is deposited by electron beam deposition and photoresist is removed by lift-off technique.
  A source and drain contact hole is formed by photolithography and ion beam etching, and then photoresist is removed.

The cross section of a ferroelectric field effect transistor having a gate length of 130 nm, as made in Example 9, is observed by a scanning electron microscope. By this observation it has been confirmed that the lateral wall layer 8 and protective layer 9 are left on the side faces of the gate stack.

Characterization of the Ferroelectric Field Effect Transistor Made in Example 9

Figure 18:
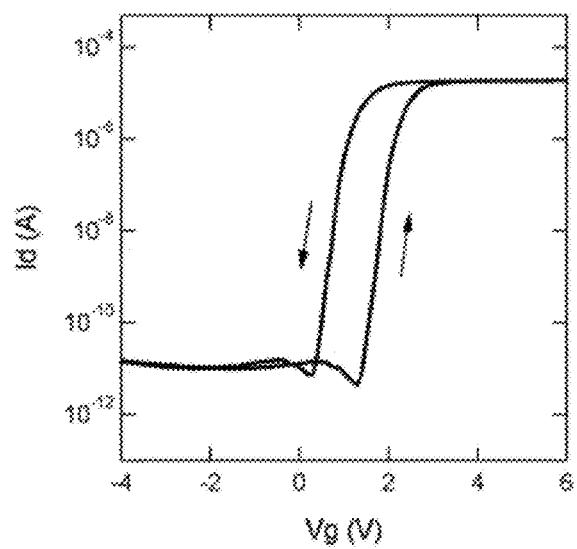
FIG. 18 is a graph illustrating a relationship between a gate voltage and a drain current in Example 9.

FIG. 18 shows an $I_d$-$V_g$ characteristic of the transistor. With the gate voltage swept in reciprocation between −4 and 6 V, a memory window of 1.06 is had (at Id=1×10$^{-7}$ A).

Figure 19:
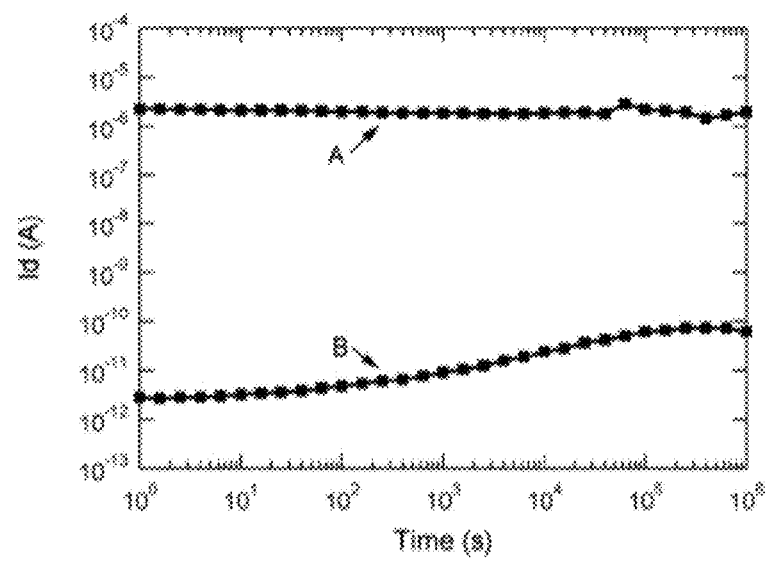
FIG. 19 is a graph illustrating results of test of data retention capability in Example 9.

FIG. 19 shows results of testing the data retention characteristic. After pulses of 0.1 second at 6 V are applied to the gate electrode, a data retention mode is entered in which reading operations are performed at suitable time intervals. At the data retention time, a retention voltage of 1.4 V is applied to the gate electrode. At the reading time, $V_g$ is swept between 1.0 and 2.1 V at $V_d$=0.1 V to measure $I_d$. A voltage value (threshold voltage) so that $I_d$=10$^{-5}$ A is read out. The results are shown by the lower curve in FIG. 19. Also, after pulses of 0.1 second at −4 V are applied to the gate electrode, a data retention mode is entered in which reading operations are performed at suitable time intervals. At the data retention time, a retention voltage of 1.4 V is applied to the gate electrode. By performing a reading operation as above, a threshold voltage is read out. The results are shown by the upper curve in FIG. 19. After a lapse of 5.625×10$^5$ seconds (about 1 week), these threshold values are sharply distinguished from each other.

Example 10

In Example 10 as an embodiment of the present invention, a ferroelectric field effect transistor is made which is structured as shown in FIG. 14 and which has a first ferroelectric, i.e. a ferroelectric 3, having a thickness of 120 nm and formed of SCBT by a PLD technique and a second ferroelectric, i.e. a lateral wall layer 8, having a thickness of 8 nm and formed of SCBT by a MOCVD technique. Process steps are shown below.

1. Surface Treatment of Semiconductor 1
  Si Substrate Cleaning: The substrate is immersed in buffer HF to remove a surface oxide film and then cleansed with ultrapure water.
2. Forming of Insulator 2
  Build-up of Insulator Buffer Layer: Deposition of HfO$_2$ of 7 nm thick doped with nitrogen, by a PLD technique.
  Substrate Temperature: 220° C.
3. Forming of First Ferroelectric or of Ferroelectric 3
  Ferroelectric Film Deposition: Deposition of SCBT of 120 nm thick by a PLD technique. The substrate has a temperature of 415° C.
4. Forming of Conductor 4
  Gate Electrode Material Deposition:
  Depositing Method: Sputtering vapor deposition technique
  Thickness: 120 nm
  Material: Pt
5. Forming of Gate Mask
  Depositing a film of SiO$_2$ of 200 nm thick by a sputtering vapor deposition technique for inorganic masking
  Electron Beam Resist Application: Resist material of SAL601H-SR7
  Electron Beam Exposure and Post-Baking followed by Development with NMD3 and Cleansing with Ultrapure Water
  Etching SiO2 by an ICP high-density plasma type RIE technique to form an inorganic mask. The etching gas is a mixed gas of Cl$_4$ and Ar.
6. Gate Etching
  Etching of Gate Electrode Material Pt:
  Etching Method: Ion beam etching (ion mulling) technique
  Ion Species: Ar$^+$ ion
  Accelerating Voltage: 1.1 kV
  Etching of Ferroelectric and Insulator Buffer Layer
  Etching Method: ICP high-density plasma type RIE technique
  Etching Gas: Mixed gas of BCl$_3$ and Ar
  Antenna RF Electric Power: 600 W
  Bias Power: 400 W
7. Removal of Gate Mask
  Residual Electron Beam Resist Removal: Implemented by Introducing oxygen and ICP high-density plasma type RIE technique
8. Ion Implantation
  Implanted Ion: P$^+$ ion
  Accelerating Energy: 12 keV
  Dosage: $6 \times 10^{13}$ cm$^{-2}$
9. Forming of Second Ferroelectric, i.e. Lateral Wall Layer 8
  Deposition of SCBT by MOCVD
  Oxidizing Gas: oxygen of 1.8 SLM
  Substrate Temperature: 360° C.
  Pressure in Film Forming Chamber: 400 Pa
  Liquid Materials:
  ST-1 (concentration of 0.1 M): 0.088 sccm CT-1 (concentration of 0.1 M): 0.041 sccm Bi (MMP)$_3$: (concentration of 0.2 M): 0.134 sccm PET (concentration of 0.1 M): 0.052 sccm Film Forming Time Period: 78 seconds Film Thickness: 8 nm 10. Forming of Protective Layer of Insulator with Dielectric Constant of 1 or Less A SiO$_2$ layer of 200 nm thick is deposited or built up by RF magnetron sputtering.

11. Step of Heat Treatment

Heat Treatment is effected in oxygen under the atm. pressure, at 813° C. and for 30 minutes.

12: Forming of Contact Hole

A gate contact hole is formed by photolithography and ion beam etching, Ti is deposited by electron beam deposition and photoresist is removed by lift-off technique.

A source and drain contact hole is formed by photolithography and ion beam etching, and then photoresist is removed.

The cross section of a ferroelectric field effect transistor having a gate length of 160 nm, as made in Example 7 and machined by focused Ga ion beam, is observed by a scanning electron microscope. It has been confirmed that the outside of the gate stack structured as shown in FIG. 14 is covered with a thick film of SiO$_2$ as the protective layer 9. The lateral wall layer 8 of SCBT that is too thin could not distinctly been confirmed by the scanning electron microscope.

Characterization of the Ferroelectric Field Effect Transistor made in Example 10

Figure 21:
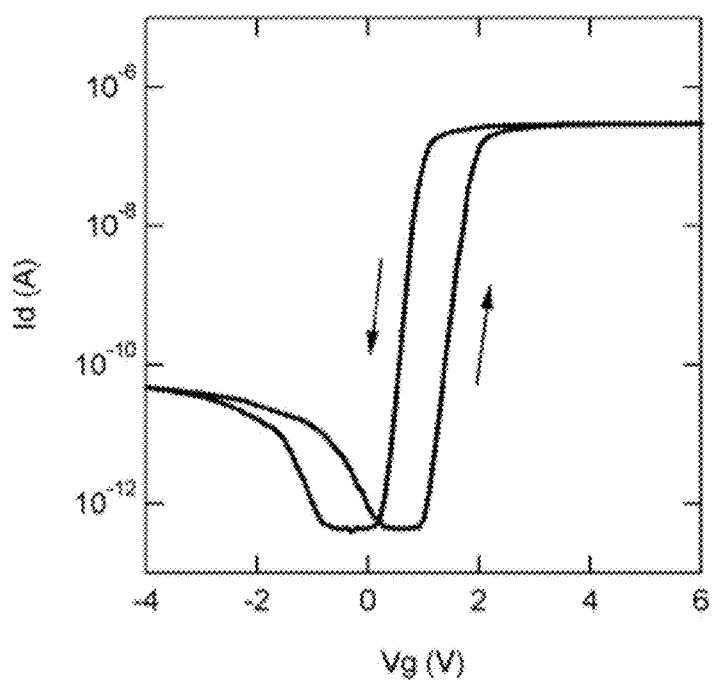
FIG. 21 is a graph illustrating a relationship between a gate voltage and a drain current in Example 10.

FIG. 21 shows an $I_d$-$V_g$ characteristic of the transistor. With the gate voltage swept in reciprocation between −4 and 6 V, a memory window of 0.88 is had (at Id=1×10$^{-8}$ A). The other conditions taken having the $I_d$-$V_g$ characteristic are: a drain voltage of 0.1 V, a source voltage of 0 V and a substrate voltage of 0 V.

In any of Examples 6, 7, 8, 9 and 10 mentioned above, the gate stack formed by gate etching is formed laterally with a second ferroelectric and an insulator having a dielectric constant or 10 or less layered in this order and is heat-treated, implementing an excellent ferroelectric field effect transistor of MFIS type.

While the foregoing embodiments of the present invention have been shown all relating to a ferroelectric device of MFIS type, it should be noted that the invention is likewise applicable to ferroelectric devices of MFS type as noted in Patent Reference 5, and to such others, as well as to a method of making a ferroelectric device in general.

What is claimed is:

1. A method of making a ferroelectric device having a semiconductor on which is had a gate stack comprising layers of an insulator, a first ferroelectric and a conductor built up in this order or a gate stack comprising layers of a first ferroelectric and a conductor built up in this order, the method comprising: the step in which layers of a second ferroelectric and an insulator that has a dielectric constant of not more than 10 are built up in this order so that the second ferroelectric may lie in contact with at least the first ferroelectric on a side face of said gate stack; and the step of thereafter heat-treating said gate stack.

2. A method of making a ferroelectric device having a semiconductor on which is formed a gate stack comprising layers of an insulator, a first ferroelectric and a conductor built up in this order or a gate stack comprising layers of a first ferroelectric and a conductor built up in this order, the method comprising the step in which a layer of a second ferroelectric mainly constituted of an oxide of strontium, calcium, bismuth and tantalum is formed by a metal organic chemical vapor deposition process so as to lie in contact with at least the first ferroelectric on a side face of said gate stack.

3. A method of making a ferroelectric device as set forth in claim 1, wherein the layer of said second ferroelectric has a thickness of not more than 100 nanometers.

4. A method of making a ferroelectric device as set forth in claim 3, wherein the layer of said second ferroelectric has a thickness of not more than 10 nanometers.

5. A method of making a ferroelectric device as set forth in claim 1, wherein said second ferroelectric is made by a metal organic chemical vapor deposition process which comprises: preparing a raw material liquid solution having complex compounds each dissolved in a solvent, the complex compounds containing strontium, calcium, bismuth and tantalum; dispersing the raw material liquid solution into a carrier gas to form a raw material gaseous medium in a state of gas and liquid two phases; introducing the raw material gaseous medium while in the state of gas and liquid two phases into a vaporizing chamber to form a vapor thereof; and introducing the vapor into a film forming chamber.

6. A method of making a ferroelectric device as set forth in claim 1, wherein of said layer of the second ferroelectric formed, a portion on the side face of said gate stack is left and a portion on a non-gate surface area of said semiconductor and other than that on which said gate stack is formed is removed in which state a source and a drain region are thereafter formed on the surface of said semiconductor.

7. A method of making a ferroelectric device as set forth in claim 6, wherein removal of said portion of the layer of the second ferroelectric is effected without masking or masklessly.

8. A method of making a ferroelectric device as set forth in claim 6 wherein removal of said portion of said layer of the second ferroelectric on the semiconductor surface area is effected by an RIE technique.

9. A method of making a ferroelectric device as set forth in claim 1, wherein a said complex compound that contains calcium is:

Ca[Ta(OC$_2$H$_5$)$_5$(OC$_2$H$_4$OCH$_3$)]$_2$ or Ca(C$_{11}$H$_{19}$O$_2$)$_2$.

10. A method of making a ferroelectric device as set forth in claim 2, wherein first ferroelectric is mainly composed of an oxide of strontium, calcium, bismuth and tantalum and has a proportion of strontium to calcium of 1−x:x wherein x is not more than 0.5.

11. A method of making a ferroelectric device as set forth in claim 1, wherein said second ferroelectric is mainly composed of an oxide of strontium, calcium, bismuth and tantalum and has a proportion of strontium to calcium of 1−x:x wherein x is not more than 0.5.

12. A method of making a ferroelectric device as set forth in claim 1, wherein the device has a gate length of not more than 200 nm.

13. A ferroelectric device, comprising a semiconductor on which is had a gate stack comprising layers of an insulator, a first ferroelectric and a conductor built up in this order or a gate stack comprising a first ferroelectric and a conductor built up in this order; and that layers of a second ferroelectric and an insulator that has a dielectric constant of not more than 10 are built up in this order so that the second ferroelectric may lie in contact with at least the first ferroelectric on a side face of said gate stack, the said gate stack formed with said layers of the second ferroelectric and the insulator that has a dielectric constant of not more than 10 being thereafter heat-treated.

14. A ferroelectric device, comprising a semiconductor on which is had a gate stack comprising layers of an insulator, a first ferroelectric and a conductor built up in this order or a gate stack comprising layers of a first ferroelectric and a conductor built up in this order; that a layer of a second ferroelectric is built up so as to lie in contact with at least the first ferroelectric on a side face of said gate stack; and that the layer of said second ferroelectric is mainly constituted of an oxide of strontium, calcium, bismuth and tantalum, said oxide being made by a metal organic chemical vapor deposition technique.

15. A ferroelectric device as set forth in claim 13 wherein of the layer of said second ferroelectric formed, a portion on the side face of said gate stack is left and a portion on a non-gate surface area of said semiconductor and other than that on which said gate stack is formed is removed in which state a source and a drain region are thereafter formed on the surface of said semiconductor.

16. A ferroelectric device as set forth in claim 15, wherein it is formed with a gate electrode in a self-alignment manner by ion implantation effected with a mask served by said gate stack and said second ferroelectric layer formed on said side face.

17. A ferroelectric device as set forth in claim 13, wherein the surface of the semiconductor has no oxide thereof substantially included therein.

18. A ferroelectric device as set forth in claim 13, wherein said first ferroelectric has no impurity substantially included therein that is to be implanted into the source or drain electrode.

19. A ferroelectric device as set forth in claim 13, wherein the layer of said second ferroelectric has a thickness of not more than 100 nanometers.

20. A ferroelectric device as set forth in claim 19, wherein the layer of said second ferroelectric has a thickness of not more than 10 nanometers.

21. A ferroelectric device as set forth in claim 13, wherein said second ferroelectric is made in a metal organic chemical vapor deposition technique which comprises: preparing a raw material liquid solution having complex compounds each dissolved in a solvent, the complex compounds containing strontium, calcium, bismuth and tantalum; dispersing the raw material liquid solution into a carrier gas to form a raw material gaseous medium in a state of gas and liquid two phases; introducing the raw material gaseous medium while in the state of gas and liquid two phases into a vaporizing chamber to form a vapor thereof; and introducing the vapor into a film forming chamber.

22. A ferroelectric device as set forth in claim 21, wherein said complex containing calcium is $Ca[Ta(OC_2H_5)_5(OC_2H_4OCH_3)]_2$ or $Ca(C_{11}H_{19}O_2)_2$.

23. A ferroelectric device as set forth in claim 13, wherein said first ferroelectric is mainly composed of an oxide of strontium, calcium, bismuth and tantalum and has a proportion of strontium to calcium of 1−x:x wherein x is not more than 0.5.

24. A ferroelectric device as set forth in claim 14, wherein said first ferroelectric is mainly composed of an oxide of strontium, calcium, bismuth and tantalum and has a proportion of strontium to calcium of 1−x:x wherein x is not more than 0.5.

25. A ferroelectric device as set forth in claim 13, wherein the device has a gate length of not more than 200 nm.

* * * * *